United States Patent [19]

Schetzina

[11] Patent Number: 5,366,927
[45] Date of Patent: Nov. 22, 1994

[54] METHOD OF FABRICATING EPITAXIALLY DEPOSITED OHMIC CONTACTS USING GROUP II-VI SEMICONDUCTOR MATERIALS

[75] Inventor: Jan F. Schetzina, Cary, N.C.

[73] Assignee: North Carolina State University, Raleigh, N.C.

[21] Appl. No.: 128,634

[22] Filed: Sep. 28, 1993

Related U.S. Application Data

[60] Division of Ser. No. 881,599, May 12, 1992, and Ser. No. 934,190, Aug. 21, 1992, Pat. No. 5,294,833, which is a continuation-in-part of Ser. No. 881,599, Aug. 21, 1992.

[51] Int. Cl.$^5$ ........................................... H01L 21/20
[52] U.S. Cl. .................................. 437/185; 437/105; 437/126; 437/129; 437/128; 437/184; 437/133; 257/78; 257/614; 257/744; 257/745; 148/DIG. 64
[58] Field of Search ............... 437/105, 126, 129, 128, 437/184, 185; 257/78, 614, 744, 745; 148/DIG. 64

[56] References Cited

U.S. PATENT DOCUMENTS

| | | | |
|---|---|---|---|
| 4,123,295 | 10/1978 | McCaldin et al. | 148/33 |
| 4,273,596 | 6/1981 | Gutierrez et al. | 437/185 |
| 4,315,796 | 2/1982 | Nishizawa | 156/614 |
| 4,620,058 | 10/1986 | Winterling et al. | 251/741 |
| 4,685,979 | 8/1987 | Nishizawa | 437/81 |
| 4,755,663 | 7/1988 | Derkits, Jr. | 250/211 J |
| 4,801,984 | 1/1989 | Woodall | 257/191 |
| 4,887,274 | 12/1989 | Hayakawa et al. | 372/45 |
| 4,893,154 | 1/1990 | Hirai et al. | 257/77 |
| 5,008,891 | 4/1991 | Morita | 372/45 |
| 5,045,897 | 9/1991 | Ahlgren | 257/99 |
| 5,213,998 | 5/1993 | Oiu et al. | 437/185 |

FOREIGN PATENT DOCUMENTS

0475606 3/1992 European Pat. Off.

OTHER PUBLICATIONS

PCT International Search Report dated Aug. 25, 1993 of International Appl. No. PCT/US93/04342 filed Jul. 5, 1993.

*Improved Ohmic Contacts For –N ZnSe and Related P-on-N Diode Structures*, Y. Lansari et al., Appl. Phys. Lett. 61 (21), 23 Nov., 1992, pp. 2554–2556.

*HgSe, a Highly Electronegative Stable Metallic Contact for Semiconductor Devices*, Best et al., Applied Physics Letters, vol. 29, No. 7, pp. 433–434, 1976.

*Blue (ZnSe) and Green ($ZnSe_{0.9}Te_{0.1}$) Light Emitting*

(List continued on next page.)

Primary Examiner—R. Bruce Breneman
Assistant Examiner—Ramamohan Rao Paladugu
Attorney, Agent, or Firm—Bell, Seltzer, Park & Gibson

[57] ABSTRACT

An ohmic contact to a p-type zinc selenide (ZnSe) layer in a Group II-VI semiconductor device, includes a zinc telluride selenide ($ZnTe_xSe_{1-x}$) layer on the zinc selenide layer, a mercury selenide (HgSe) layer on the zinc telluride selenide layer and a conductor (such as metal) layer on the mercury selenide layer. The zinc telluride selenide and mercury selenide layers between the p-type zinc selenide and the conductor layer provide an ohmic contact by eliminating the band offset between the wide bandgap zinc selenide and the conductor. Step graded, linear graded, and parabolic graded layers of zinc telluride selenide may be provided. An integrated heterostructure is formed by epitaxially depositing the ohmic contact on the Group II-VI device. A removable overcoat layer may be formed on the Group II-VI device to allow room temperature atmospheric pressure transfer of the device from a zinc based deposition chamber to a mercury based deposition chamber, for deposition of the ohmic contact. A large area emitter may be formed by limiting the thickness of the mercury selenide layer so that optical radiation passes therethrough. A high efficiency optical emitter may be provided by using zinc telluride selenide or zinc sulfur telluride selenide to form an isoelectronic trap which produces broad and intense light output in the blue-/green region.

37 Claims, 28 Drawing Sheets

OTHER PUBLICATIONS

*Diodes,* Ren et al. Journal of Crystal Growth, vol. 111, pp. 829–832, 1991.

*Substitutional Doping of ZnSe Films,* Ren et al., Journal of Crystal Growth, vol. 111, pp. 772–775, 1991.

*ZnSe Light–Emitting Diodes,* Ren et al., Applied Physics Letters, vol. 57, No. 18, pp. 1901–1903, 1990.

*Blue/Green pn Junction Electroluminescence From ZnSe-based Multiple Quantum-Well Structures,* Xie et al., Applied Physics Letters, vol. 60, No. 4, pp. 463–465, 1992.

*Noncontact Electrical Characterization of Low–Resistivity p–Type ZnSe:N Grown by Molecular Beam Epitaxy,* Park et al., Applied Physics Letters, vol. 59, No. 16, pp. 1896–1898, 1991.

*Blue–Green Laser Diodes,* Haase et al., Applied Physics Letters, vol. 59, No. 11, pp. 1272–1274, 1991.

*Blue–Green Injection Laser Diodes in (Zn,Cd)Se/ZnSe Quantum Wells,* Jeon et al., Applied Physics Letters, vol. 59, No. 27, pp. 3619–3621, 1991.

*Lattice–Matched Heterostructures as Schottky Barriers: HgSe/CdSe,* Best et al., Journal of Vacuum Science and Technology, vol. 16, No. 5, pp. 1130–1133, 1979.

*Elimination of Heterojunction Band Discontinuities by Modulation Doping,* Schubert et al., Applied Physics Letters, vol. 60, No. 4, pp. 466–468, 1992.

*ZnSe Based Multilayer pn Junctions as Efficient Light Emitting Diodes for Display Applications,* Jeon et al., Applied Physics Letters, vol. 60, No. 7, pp. 892–894, 1992.

*Blue and Green Diode Lasers in ZnSe–based Quantum Wells,* Jeon et al., Applied Physics Letters, vol. 60, No. 17, pp. 2045–2047, 1992.

*Room Temperature Blue Light Emitting p–n Diodes from Zn(S,Se)–based Multiple Quantum Well Structures,* Xie et al., Applied Physics Letters, vol. 60, No. 16, pp. 1999–2001, 1992.

*Highly Electronegative Contacts to Compound Semiconductors,* Scranton et al., Journal of Vacuum Science Technology, vol. 14, No. 4, pp. 930–934, 1977.

*Superlattices of II–VI Semiconductors,* R. H. Miles et al., Journal of Crystal Growth 85 (1987) pp. 188–193.

*Growth and Characterization of ZnSe–ZnTe Strained–Layer Superlattices,* M. Kobayashi et al., Journal of Crystal Growth 81 (1987) pp. 495–500.

*Band Offset of the ZnSe–ZnTe Superlattices: A Fit to Photoluminescence Data by p Theory,* Y. Rajakarunanayke et al., J. Vac. Sci. Technol. B6(4), Jul./Aug. 1988, pp. 1354–1359.

*Properties of $ZnSe-ZnSe_{0.9}Te_{0.1}$ and $Zn-Se-Zn_{0.9}Cd_{0.1}Se$ Multilayers,* J. Ren et al., Journal of Crystal Growth 117 (1992) pp. 510–514.

*Exciton Trapping at Tellurium Iso–Electronic Centres in ZnSe–ZnTe Superlattices,* J. J. Davies, Semicond. Sci. Technol. 3 (1988) pp. 219–222.

METHOD OF FABRICATING EPITAXIALLY DEPOSITED OHMIC CONTACTS USING GROUP II-VI SEMICONDUCTOR MATERIALS

U.S. GOVERNMENT RIGHTS

This invention was made with government support under Grant No. DMR-88-13525 awarded by the National Science Foundation. The U.S. Government has certain rights in the invention.

CROSS REFERENCE TO RELATED APPLICATION

This application is a divisional of application Ser. No. 07/881,599 filed May 12, 1992 and of application Ser. No. 07/934,190 filed Aug. 21, 1992, now U.S. Pat. No. 5,294,833, which is a continuation-in-part of the aforesaid application Ser. No. 07/881,599 now pending.

FIELD OF THE INVENTION

This invention relates to semiconductor devices, and more particularly to semiconductor devices formed of Group II-VI compound semiconductor materials.

BACKGROUND OF THE INVENTION

Microelectronic applications of Group II-VI semiconductor materials have been widely investigated. In particular, the wide bandgap Group II-VI semiconductor zinc selenide (ZnSe), and its related alloys such as zinc cadmium selenide (ZnCdSe) and zinc sulfur selenide (ZnSSe), are being widely investigated as optoelectronic devices which are effective from the blue to the green region of the visible spectrum. As is well known to those having skill in the art, the wide bandgap of these Group II-VI devices compared to their equivalent nearly lattice matched Group III-V or elemental semiconductor materials, make these wide bandgap Group II-VI semiconductors potential candidates for blue to green optoelectronic devices. Blue to green optoelectronic sources are currently sought for a number of applications, including full color electroluminescent displays, read-write laser sources for high density information storage on magnetic and optical media, sources for undersea optical communications and other applications.

Molecular beam epitaxy and other fabrication techniques have recently been developed so that both n-type and p-type doped layers of zinc selenide and other related II-VI semiconductor materials may be grown. See for example a publication by Ren et al. entitled *Substitutional Doping of ZnSe Films*, Journal of Crystal Growth, Vol. 111, pp. 772–775, 1991. It has also long been known to make Schottky contacts to n-type zinc selenide using mercury selenide (HgSe). See the publications entitled *HgSe, a Highly Electronegative Stable Metallic Contact for Semiconductor Devices* by Best et al., Applied Physics Letters, Vol. 29, No. 7, pp. 433–434, 1976; *Highly Electronegative Contacts to Compound Semiconductors* by Scranton et al., Journal of Vacuum Science and Technology, Vol. 14, No. 4, pp. 930–934, 1977; and *Lattice-Matched Heterostructures as Schottky Barriers: HgSe/CdSe* by Best et al., Journal of Vacuum Science Technology, Vol. 16, No. 5, pp. 1130–1133, 1979.

As a result of these and other developments, at least four research groups have recently described the fabrication of blue and/or green light emitting diodes and/or laser diodes from Group II-VI semiconductors.

The first group is from North Carolina State University (NCSU) and includes the present inventor. The fabrication of blue and green light emitting diodes based on ZnSe and alloys thereof is described in a publication entitled *ZnSe Light-Emitting Diodes* by Ren et al., Applied Physics Letters, Vol. 57, No. 18, pp. 1901–1903, October, 1990, and *Blue (ZnSe) and Green ($ZnSe_{0.9}Te_{0.1}$) Light Emitting Diodes* by Ren et al., Journal of Crystal Growth, Vol. 111, pp. 829–832, 1991.

A second group of researchers from Brown University and Purdue University have also described zinc selenide based laser diodes and light emitting diodes in publications entitled *Blue-Green Injection Laser Diodes in (Zn, Cd)Se/ZnSe Quantum Wells* by Jeon et al., Applied Physics Letters Vol. 59, No. 27, pp. 3619–3621, December, 1991; *Blue/Green pn Junction Electroluminescence from ZnSe-based Multiple Quantum-Well Structures* by Xie et al., Applied Physics Letters Vol. 60, No. 4, pp. 463–465, January, 1992; *ZnSe Based Multilayer pn Junctions as Efficient Light Emitting Diodes for Display Applications*, Jeon et al., Applied Physics Letters, Vol. 60, No. 7, pp. 892–894, February, 1992; *Blue and Green Diode Lasers in ZnSe-Based Quantum Wells*, Jeon et al., Applied Physics Letters, Vol. 60, No. 17, April, 1992; and *Room Temperature Blue Light Emitting P-N Diodes from Zn(S,Se)-Based Multiple Quantum Well Structures*, Xie et al., Applied Physics Letters, Vol. 60, No. 16, April, 1992, pp. 1999–2001.

A third group from 3M Company described a zinc selenide based laser diode in an article entitled *Blue-Green Laser Diodes* by Haase et al., Applied Physics Letters, Vol. 59, No. 11, pp. 1272–1274, September, 1991. A fourth group from the University of Florida and Bellcore described fabrication of LEDs and light emitting diodes using zinc selenide in an article entitled *Noncontact Electrical Characterization of Low-Resistivity p-type ZnSe:N Grown by Molecular Beam Epitaxy* by Park et al., Applied Physics Letters, Vol. 59, No. 15, pp. 1896–1898, 1991.

The above publications indicate that the art has now successfully fabricated blue and green optoelectrical devices from ZnSe-based materials. As Group II-VI fabrication processes are further refined, optical characteristics such as frequency spectrum width and operational lifetime are expected to improve due to reduced dislocation densities in the materials and other improvements.

A major problem with all of these devices, however, has been the ohmic (nonrectifying) contact to zinc selenide, and in particular to p-type zinc selenide. This is a fundamental problem, which is related to the very deep energy of the valence band of zinc selenide. As a consequence, contacts to p-type zinc selenide and related alloys, using conventional metals such as silver or gold, are not ohmic. In effect, the contacts which have been considered by researchers as being ohmic, actually constitute a reverse biased Schottky diode in series with the device, resulting in a large voltage drop across the supposedly ohmic contact. This large voltage drop results in almost all of the input power to the device being lost as heat. High voltages, of 20–50 V or more, have been required in order to induce optical emission, and the resultant heat destroys the devices.

The "ohmic contact problem" for zinc selenide optical emitter devices has been widely reported. See for example the above cited 1990 Ren et al. article from the NCSU group, at page 1901: "It was not possible for us to complete Hall effect studies on the ZnSe:Li samples because of problems associated with non-ohmic contacts." See also the above cited 1992 article by Xie et al. from the Brown-Purdue group, at page 463: "Hall measurements on the p-type layers were unreliable due to the difficulty in forming ohmic contacts to the wide-gap semiconductor." See also the Haase et al. article by the 3M group at page 1273: "Heating in these samples is a serious problem as the contact between the Au and the p-ZnSe presents a large barrier." Finally, see the Park et al. article from the University of Florida/Bellcore group which notes that ". . . serious problems currently exist with regard to providing low-resistance ohmic contact to p-type ZnSe material . . . "

The above survey indicates that although significant advances have been made in fabricating Group II-VI devices, and in particular zinc selenide based optoelectronic devices, the ohmic contact to these devices, and in particular to p-type zinc selenide, remains a fundamental concern that has heretofore eluded multiple independent groups of researchers.

SUMMARY OF THE INVENTION

It is therefore an object of the present invention to provide an improved Group II-VI semiconductor device including an ohmic contact therefor.

It is another object of the invention to provide an improved Group II-VI optoelectronic device including an ohmic contact therefor.

It is still another object of the invention to provide an ohmic contact for p-type zinc selenide and alloys thereof.

These and other objects are provided, according to the present invention by an ohmic contact for a semiconductor device formed of Group II-VI semiconductor materials, wherein the contact includes a lattice matched monocrystalline ternary compound Group II-VI semiconductor material on the Group II-VI semiconductor device, a lattice matched monocrystalline Group II-VI semimetal on the Group II-VI semiconductor material and a conductor, such as a metal, on the Group II-VI semimetal. The ternary compound Group II-VI semiconductor material and the semimetal, between the Group II-VI semiconductor material and the conductor layer, eliminate the band offset between the wide bandgap Group II-VI semiconductor material and the conductor layer, to thereby provide an ohmic contact for the Group II-VI semiconductor material.

In particular, according to the invention, an ohmic contact for zinc selenide (ZnSe) or an alloy thereof, and particularly for p-type zinc selenide or an alloy thereof, is provided by a heterostructure including a zinc mercury selenide ($Zn_xHg_{1-x}Se$) layer or a zinc telluride selenide ($ZnTe_xSe_{1-x}$) layer on the layer of zinc selenide or alloy thereof, and a mercury selenide (HgSe) layer on the zinc mercury selenide or zinc telluride selenide layer. A conductor (such as metal) layer is formed on the mercury selenide layer. The zinc mercury selenide or zinc telluride selenide layer, and the mercury selenide layer between the p-type zinc selenide and the conductor layer, provide an ohmic contact by eliminating the band offset between the wide bandgap zinc selenide and the conductor.

Many alternative formulations of the zinc mercury selenide layer and the zinc telluride selenide layer of the present invention may be provided. In particular, the ratio of zinc to mercury, or tellurium to selenium, may be constant across the layer to provide a step graded zinc mercury selenide layer or zinc telluride selenide layer. Alternatively, the amount of mercury or tellurium may increase from the zinc selenide layer to the mercury selenide layer. One form of increase is a linear increase, to provide a linear graded zinc mercury selenide or zinc telluride selenide layer. Alternatively, and preferably, the amount of mercury or tellurium increases nonlinearly from the zinc selenide layer to the mercury selenide layer to provide a nonlinear graded zinc mercury selenide or zinc telluride selenide layer. Preferably, a parabolic graded layer is provided, in which the amount of mercury or tellurium increases parabolically.

According to the invention, at least some of the zinc mercury selenide layer or zinc telluride selenide layer adjacent the p-type zinc selenide layer is doped p-type. Preferably, half the thickness of the zinc mercury selenide layer or zinc telluride selenide layer, adjacent the zinc selenide layer, is doped p-type, and the other half of the zinc mercury selenide layer or zinc telluride selenide layer, adjacent the mercury selenide layer, is of neutral conductivity. Modulation doping may also be used in the parabolically graded zinc mercury selenide layer or zinc telluride selenide layer.

It has also been found, according to the present invention, that a p-type layer of mercury selenide between the p-type zinc selenide layer and the conductor layer, can provide an ohmic contact for p-type zinc selenide which is far superior to conventional gold or silver ohmic contacts. The ohmic contacts of the present invention produce a nearly ideal (linear) voltage-current relation, indicating that the contacts are indeed ohmic. Hall effect measurements may also be taken, which verify that the contacts are ohmic. When a Group II-VI optoelectronic device is integrated with the ohmic contacts of the present invention, an integrated heterostructure device is formed, with one heterostructure providing an optical function such as e.g. light emission, and another heterostructure providing an electrical function such as ohmic contact. These integrated heterostructures can emit radiation in the blue to green frequency range with an input voltage of five volts or less, resulting in high efficiency Group II-VI optoelectronic devices.

According to another aspect of the present invention, in certain applications it is desirable to provide large area optical emitters such as light emitting diodes (LED), in .which the light is emitted from the top and sides of the LED. Such large area LEDs can be used to produce numerical display arrays and many other devices. According to the invention, the integrated heterostructures of the present invention may be used to produce large area optical emitters by providing a mercury selenide layer, or a mercury selenide layer on the zinc mercury selenide or zinc telluride selenide layer, which is sufficiently thick to provide an ohmic contact to the p-type zinc selenide layer, and is sufficiently thin to pass optical emissions from the optical emission heterostructure therethrough. Preferably, a mercury selenide layer less than about 100 Å thick, is provided. Although mercury selenide is a semimetal which absorbs radiation through the visible and infrared spectral regions, the thin mercury selenide layer is thin enough to limit the light absorption losses to less than 10%. Moreover, since mercury selenide is of very high conductivity, the mercury selenide layer is sufficiently thick to act as a semitransparent electrode which covers the top of the heterostructure. In order to further reduce the surface contact resistance, a transparent conductor layer such as indium tin oxide may be formed on the thin layer of mercury selenide.

An integrated heterostructure according to the present invention may be formed by epitaxially forming an optical heterostructure and an electrical heterostructure as described above. Typically, the optical heterostructure (such as a laser diode or light emitting diode) is formed in a first chamber, using molecular beam epitaxy (MBE) of zinc selenide and related alloys. The zinc mercury selenide electrical heterostructure (ohmic contact) is typically fabricated in a second deposition chamber because of the special requirements for depositing mercury based materials. Transfer between the first and second chambers typically must take place under ultra high vacuum conditions.

Alternatively, according to the present invention, a mercury based electrical heterostructure may be formed on a zinc selenide based optical heterostructure without the need for ultra high vacuum transfer between MBE chambers, by forming a thin overcoat layer, for example, selenium, on the optical heterostructure. This structure can then be removed from the zinc selenide MBE chamber and inserted into a mercury based MBE chamber at room temperature and under atmospheric conditions. Once the structure is placed in the mercury based chamber, and the chamber is evacuated, the selenium overcoat layer may be evaporated and the mercury based electrical heterostructure may be epitaxially formed on the zinc selenide based optical heterostructure.

Similarly, in order to prepare the integrated heterostructure of the present invention which includes a zinc telluride selenide layer, the optical heterostructure (such as a laser diode or light emitting diode) is formed in a first chamber, using molecular beam epitaxy (MBE) of zinc selenide and related alloys. The zinc telluride selenide layer of the electrical heterostructure (ohmic contact) is also fabricated in the first deposition chamber, for example by continuing molecular beam epitaxy growth at about 250° C. Growth of a graded zinc telluride selenide layer may be accomplished by decreasing the temperature of the selenium MBE source oven, preferably under computer control, while increasing the source temperature of the tellurium MBE source oven. An optional thin layer (about 100 Å) of p-type zinc telluride may be formed on the graded layer of zinc telluride selenide.

Following deposition of the zinc telluride selenide graded layer, a thin overcoat layer, for example selenium, is formed. The structure can then be removed from the first MBE chamber and inserted into a second, mercury based MBE chamber at room temperature and under atmospheric conditions. Once the structure is placed in the mercury based chamber, and the chamber is evacuated, the selenium overcoat layer may be evaporated, and a layer of mercury selenide may be deposited at about 100° C. in the second MBE chamber. Accordingly, the zinc telluride selenide layer can be grown in a first MBE chamber using the same low growth temperature (about 250° C.) as the optical heterostructure of the integrated heterostructure device. The graded layer can be doped p-type using nitrogen from the same remote plasma source that is used to prepare the p-type layers of the optical portion of the integrated heterostructure device. Accordingly, growth of the layer of zinc telluride selenide is simpler than the growth of the zinc mercury selenide layer of application Ser. No. 07/881,599.

According to yet another aspect of the present invention, a high efficiency blue/green optical emitter is formed using a layer of the quaternary alloy zinc sulfur telluride selenide ($ZnS_xTe_ySe_z$, where $x+y+z=1$) between two layers of zinc sulfur selenide (ZnSSe), or a layer of the ternary compound zinc telluride selenide ($ZnTe_xSe_{1-x}$) between layers of zinc selenide (ZnSe). The zinc sulfur telluride selenide or zinc telluride selenide layers form a quantum well, and multiple layers may be used to form multiple quantum wells. In an LED application, a layer about 1000 Å thick will typically be formed while in a laser, a layer about 100–200 Å thick will be formed. Tellurium forms an isoelectronic trap which produces broad and intense light output in the blue/green spectral region.

The cladded zinc sulfur telluride selenide or zinc telluride selenide structure is preferably formed on a substrate such as gallium arsenide or zinc selenide. Zinc sulfur selenide and zinc sulfur telluride selenide are used with gallium selenide substrates because of their close lattice match thereto. For zinc selenide substrates, zinc selenide and zinc telluride selenide are used. A mercury selenide, zinc mercury selenide or zinc telluride selenide layer is used to form an ohmic contact to the zinc selenide or zinc sulfur selenide. The emitters are relatively easy to fabricate because no adjustments need be made to the zinc, sulfur, tellurium or selenium fluxes. Rather, these fluxes need only be turned on and off at the appropriate time during deposition to form the structure.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
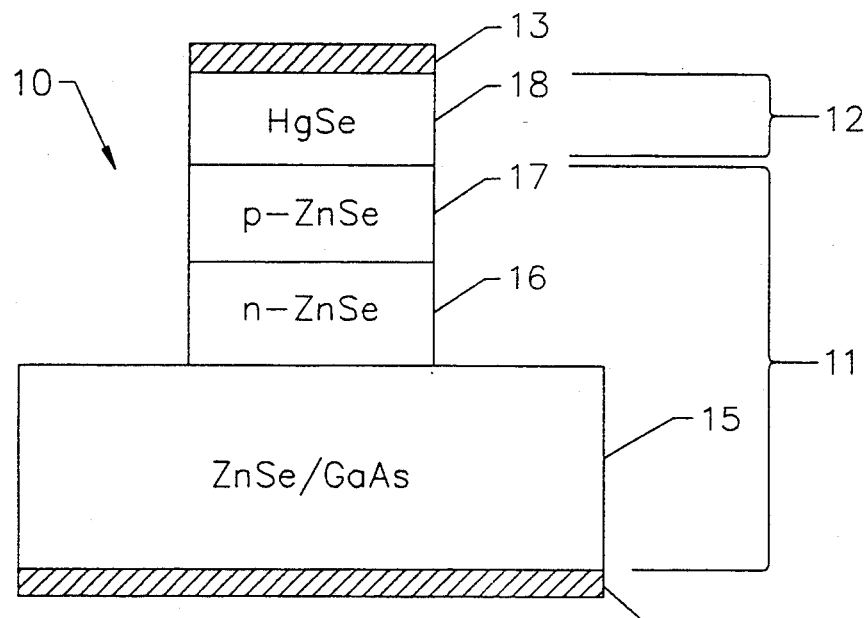
FIG. 1 is a cross-sectional illustration of a first embodiment of an optical emitter having an ohmic contact according to the present invention.

Referring now to FIG. 1, a first embodiment of an optical emitter having an ohmic contact according to the present invention is illustrated. Optical emitter 10 is an integrated heterostructure including an optical heterostructure 11 and an electrical heterostructure 12. Optical heterostructure 11 can be a well known blue to green light emitting diode or laser diode structure, or any other Group II-VI device now known or discovered later. As shown in FIG. 1, the optical heterostructure 11 is a blue light emitting diode (LED). The blue LED is formed on a substrate 15 of zinc selenide, gallium arsenide or any other known material. The LED is a p-n junction between n-type zinc selenide layer 16 and p-type zinc selenide layer 17. Both zinc selenide layers may be formed on substrate 15 using well known techniques such as molecular beam epitaxy, and both layers may be doped at $10^{18}$ carrier per cubic centimeter. Bottom contact 14 is formed of metal such as gold-germanium for n-type GaAs or indium for n-type ZnSe, or other well known conductors. It will be understood by those having skill in the art, that, as used herein, when a layer is formed "on" another layer, it may be formed directly on the underlying layer, or one or more intervening layers may be present.

Figure 2:
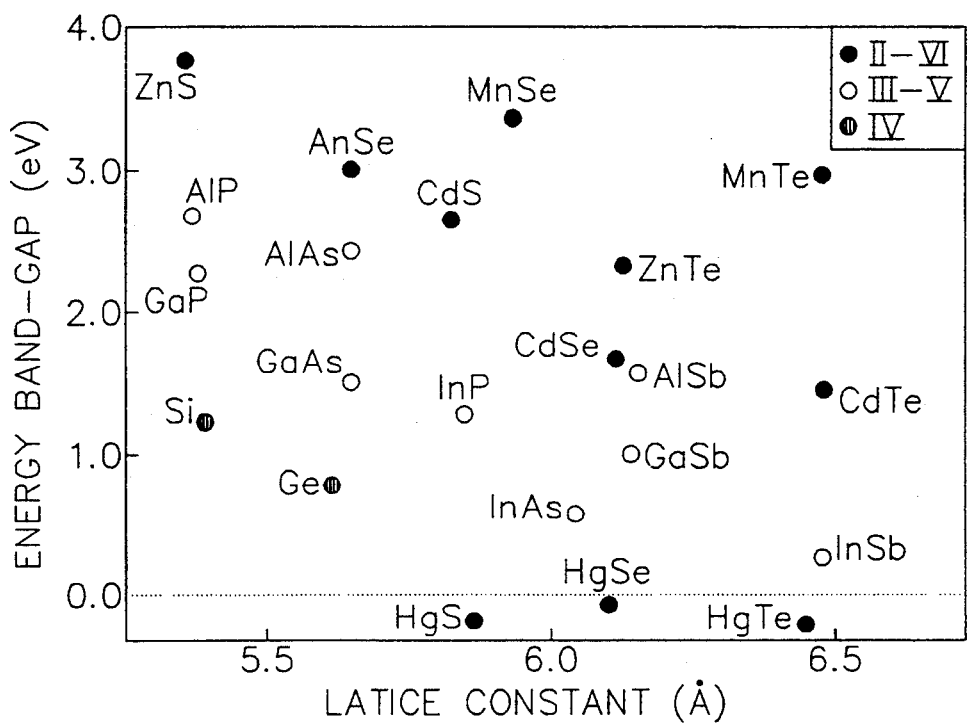
FIG. 2 graphically illustrates energy bandgap versus lattice constant for selected semiconductor materials.

Still referring to FIG. 1, the electrical portion 12 of the integrated heterostructure 10 comprises a layer of mercury selenide. As is well known to those having skill in the art, mercury selenide is a semimetal rather than a semiconductor, because it has a bandgap that is zero. It will be understood by those having skill in the art that the integrated optical structure 11 and electrical structure 12 is epitaxially formed as a monolithic structure, with lattice match between adjacent layers so as to produce minimal dislocations at the junctions between the layers. FIG. 2 illustrates the energy bandgap versus lattice constant for various Group IV single element semiconductors, Group III-VI compound semiconductors and Group II-VI compound semiconductors and semimetals.

Figure 3:
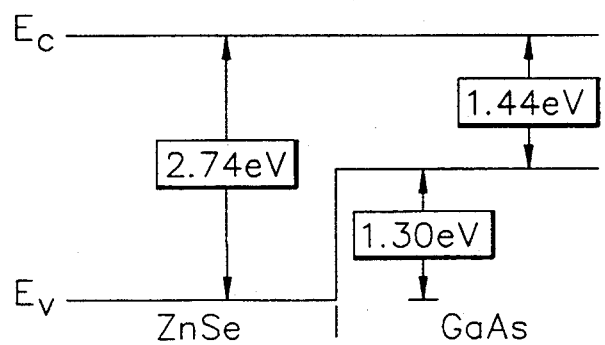
FIG. 3 is an energy band diagram illustrating the band offsets between zinc selenide and gallium arsenide.
Figure 4:
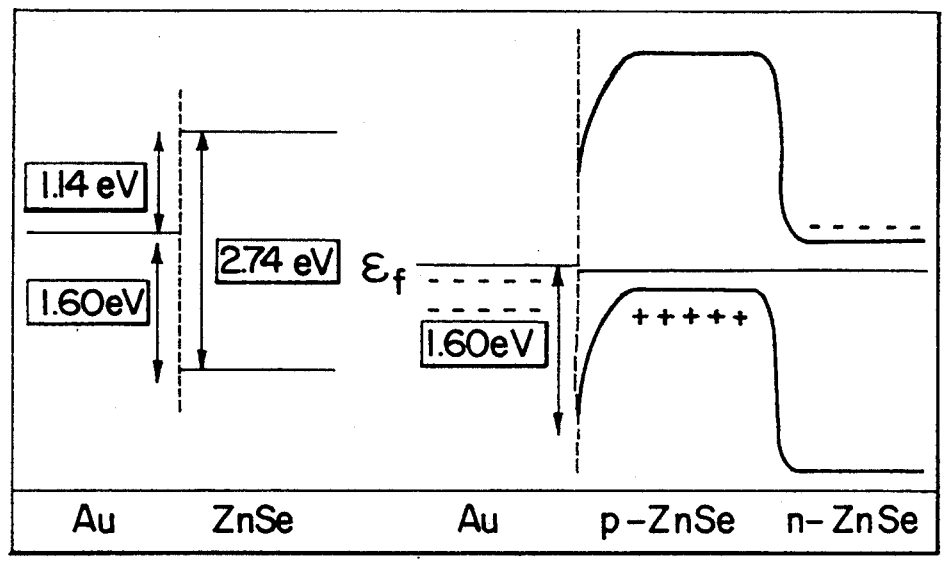
FIG. 4 is an energy band diagram showing the energy band lineup between gold and zinc selenide.
Figure 5:
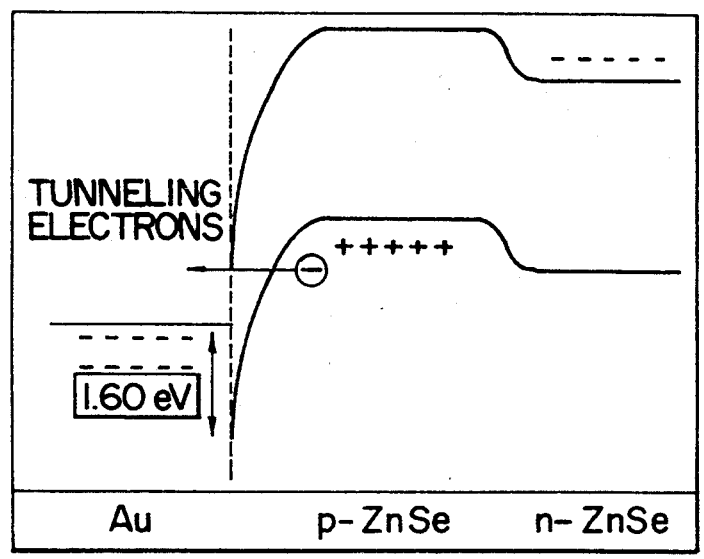
FIG. 5 is an energy band diagram illustrating the band lineups of a zinc selenide p-on-n diode under forward bias.

It has been found, according to the invention, that mercury selenide forms a good ohmic contact to p-type zinc selenide and thereby solves the last fundamental problem in development of high efficiency Group II-VI devices. FIG. 3 illustrates the origin of the ohmic contact problem. As shown in FIG. 3, there is essentially no conduction band ($E_c$) offset between zinc selenide and gallium arsenide. As a consequence, valence band ($E_v$) offset is very large: about 1.3 electron volts (eV). The deep valence band of zinc selenide is the source of the ohmic contact problem. Gold, which has the largest work function of all metals, has proven to be an ineffective ohmic contact to zinc selenide. Gold forms a barrier of about 1.1 electron volts on n-type zinc selenide. A gold/zinc selenide interface, as shown in FIG. 4, produces a band offset of about 1.6 electron volts. Accordingly, the use of gold as an ohmic contact to a p-on-n zinc selenide homojunction, produces the band bending shown in FIG. 5.

Figure 6:
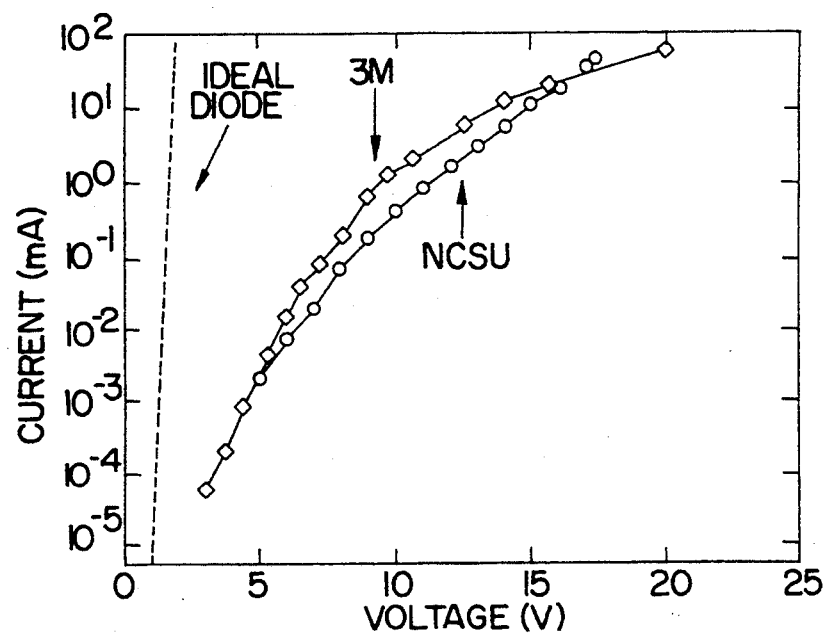
FIG. 6 graphically illustrates the current-voltage characteristics of various zinc selenide based heterostructures.

Under forward bias of the zinc selenide diode, the gold/p-type zinc selenide junction is reverse biased and current flow is limited by carrier tunneling through the heterobarrier. This is illustrated by the current-voltage characteristics shown in FIG. 6 as reported by the 3M Group for their initial laser diode. Data for LED's prepared by the NCSU group is also shown to illustrate that the forward characteristics are similar for samples prepared in different laboratories. This data strongly suggests that the current limiting device is a series diode undergoing reverse breakdown. This diode is associated with reverse breakdown via carrier tunneling of the gold-zinc selenide Schottky diode heterointerface.

Figure 7:
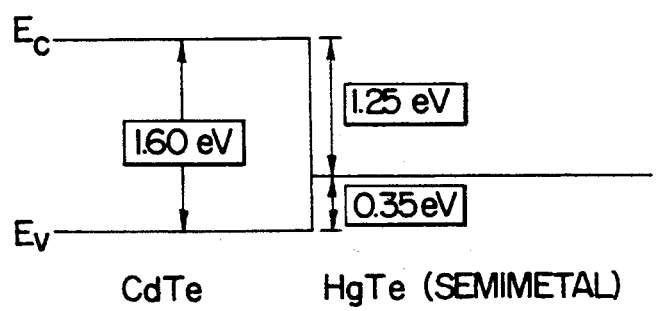
FIG. 7 is an energy band diagram showing the band lineup between cadmium telluride and mercury telluride.

In order to develop high efficiency LEDs and lasers from zinc selenide and related materials, the ohmic contact problem must be solved. A solution to the ohmic contact problem has been found by studying the valence band offset between mercury telluride (HgTe) and cadmium telluride (CdTe). As shown in FIG. 7, it has been found that the valence band offset is 0.35 electron volts. Earlier estimates, based on the "common anion rule" implied a band offset of zero. Accordingly, the common anion rule must be rephrased as a "modified common anion rule" for Group II-VI materials containing mercury which is consistent with the mercury telluride/cadmium telluride valence band offset results. As shown in FIG. 7, a modified common anion rule gives:

$$\Delta E_c / \Delta E_v = 1.25/0.350 = 3.6 \qquad (1)$$

Figure 8:
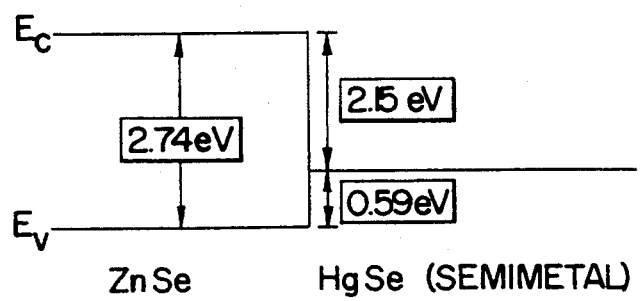
FIG. 8 is an energy band diagram showing the band lineups between zinc selenide and mercury selenide.

If Equation (1) holds for the mercury selenide/zinc selenide interface, then $$\Delta E_c + \Delta E_v = E_{q(ZnSe)} = 2.70 \ eV \quad (2)$$

and a valence band offset $\Delta E_v$ of 0.59 electron volts is obtained for the mercury selenide/zinc selenide interface as shown in FIG. 8. This represents nearly a threefold decrease compared to a gold/zinc selenide interface barrier of about 1.6 electron volts. Thus, a layer of epitaxial mercury selenide on p-type zinc selenide should provide a much better ohmic contact than gold.

Figure 9:
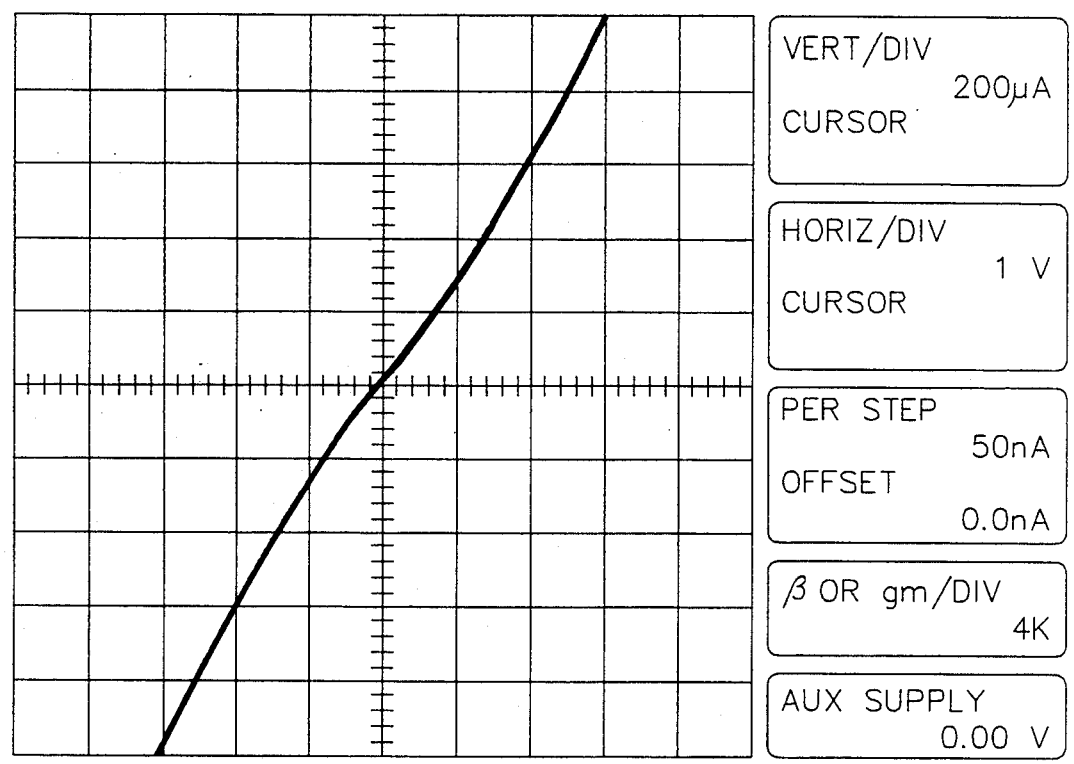
FIG. 9 is a graphical illustration of the voltage current relationship for an ohmic contact according to the present invention.

FIG. 9 graphically illustrates the voltage-current relationship for an ohmic contact according to the present invention. In order to fabricate this ohmic contact, a layer of mercury selenide was grown, by molecular beam epitaxy, onto p-type (nitrogen doped) zinc selenide samples. Standard photolithographic processing was then used to define four contacts on each of the samples for Hall effect measurements. FIG. 9 shows the current-voltage relationship between adjacent Hall contacts one centimeter apart of a representative sample. Apart from a small (about 0.1 volt) offset, the contacts are very nearly ohmic, thus indicating that electrical contacts, good enough for Hall effect measurement, are now available.

Several diode structures were prepared using molecular beam epitaxy deposition. The p-type layers included zinc sulfur selenide doped with nitrogen followed by a layer of nitrogen doped p-type zinc selenide and a layer of mercury selenide. Diodes were then prepared for testing using standard techniques.

Figure 10A:
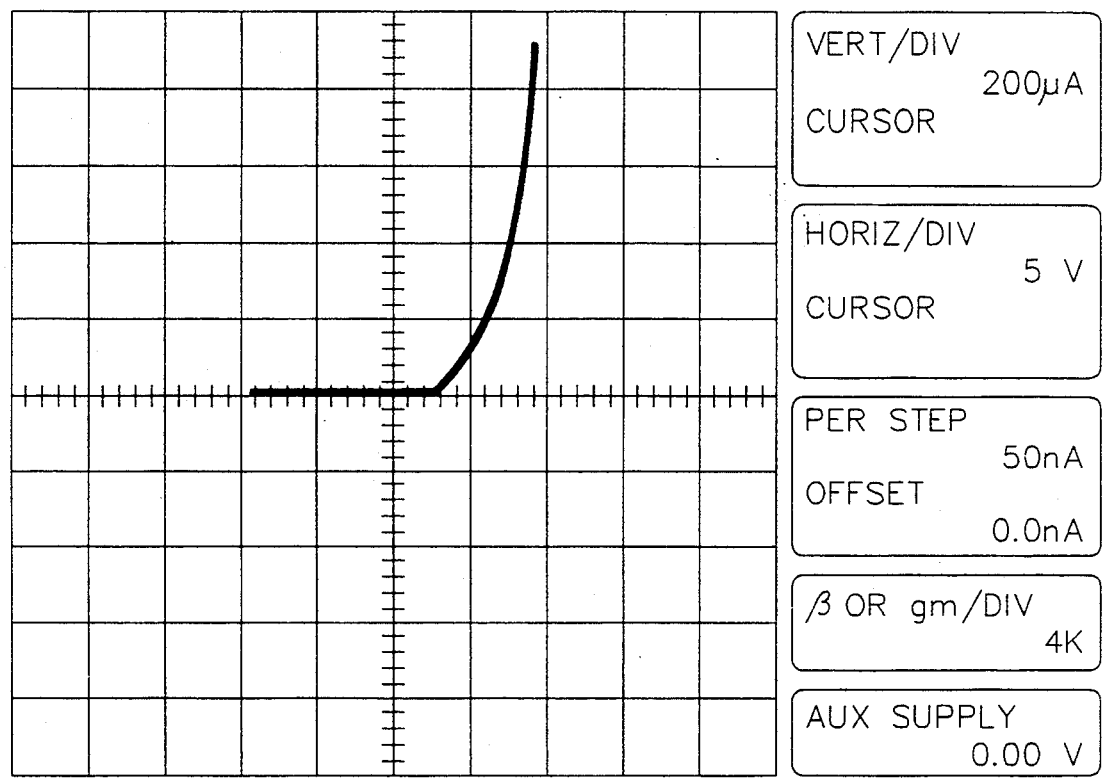
FIG. 10a illustrates the current-voltage relationship for a known zinc selenide light emitting diode.
Figure 10B:
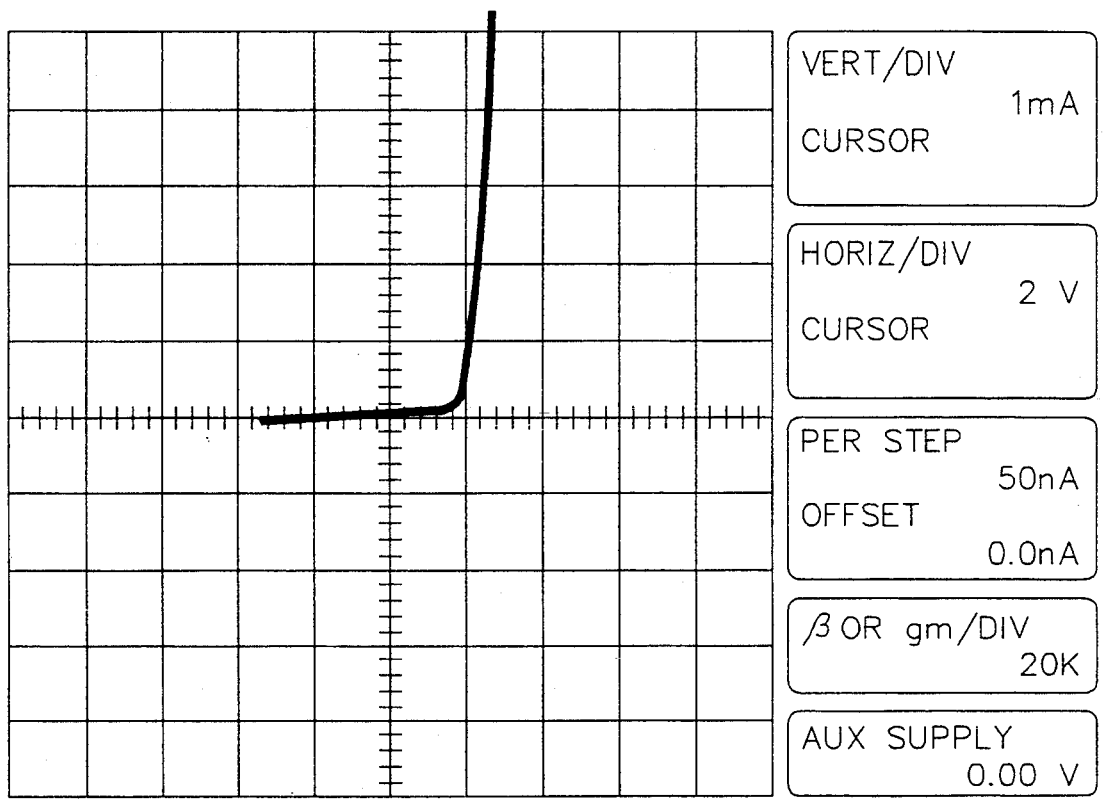
FIGS. 10b–10d illustrate the current-voltage relationships for light emitting diodes including an ohmic contact according to the present invention.
Figure 10C:
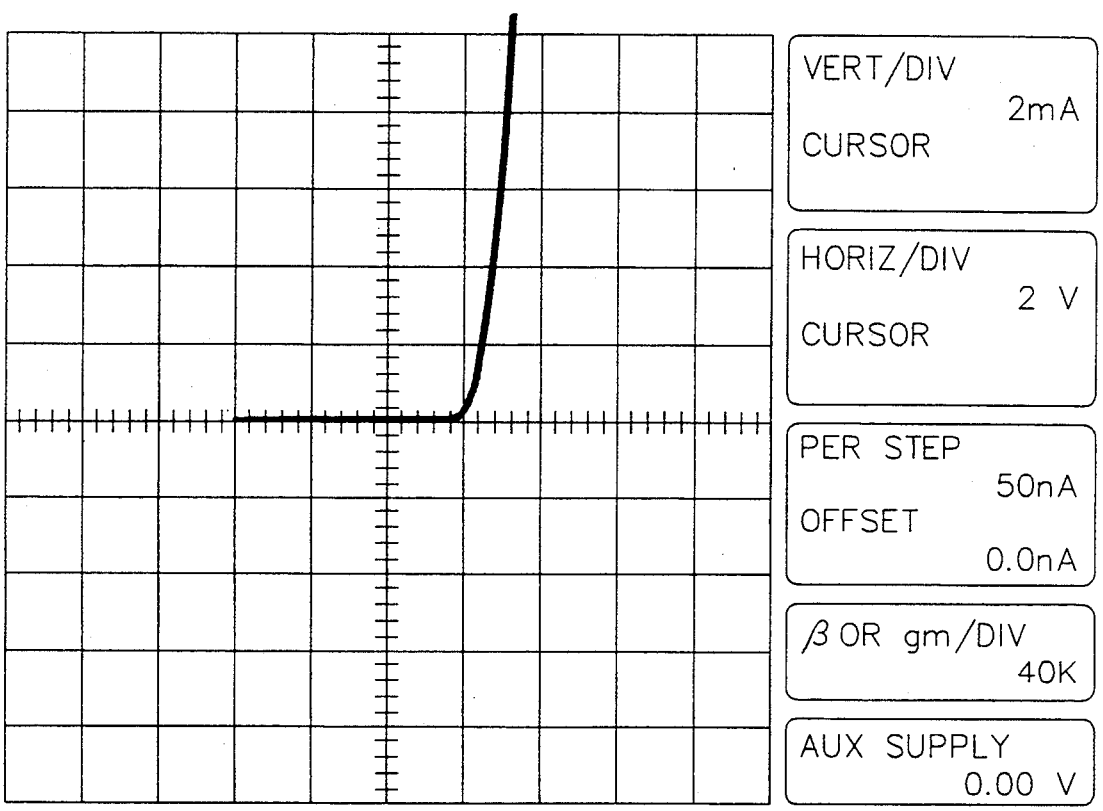
Figure 10D:
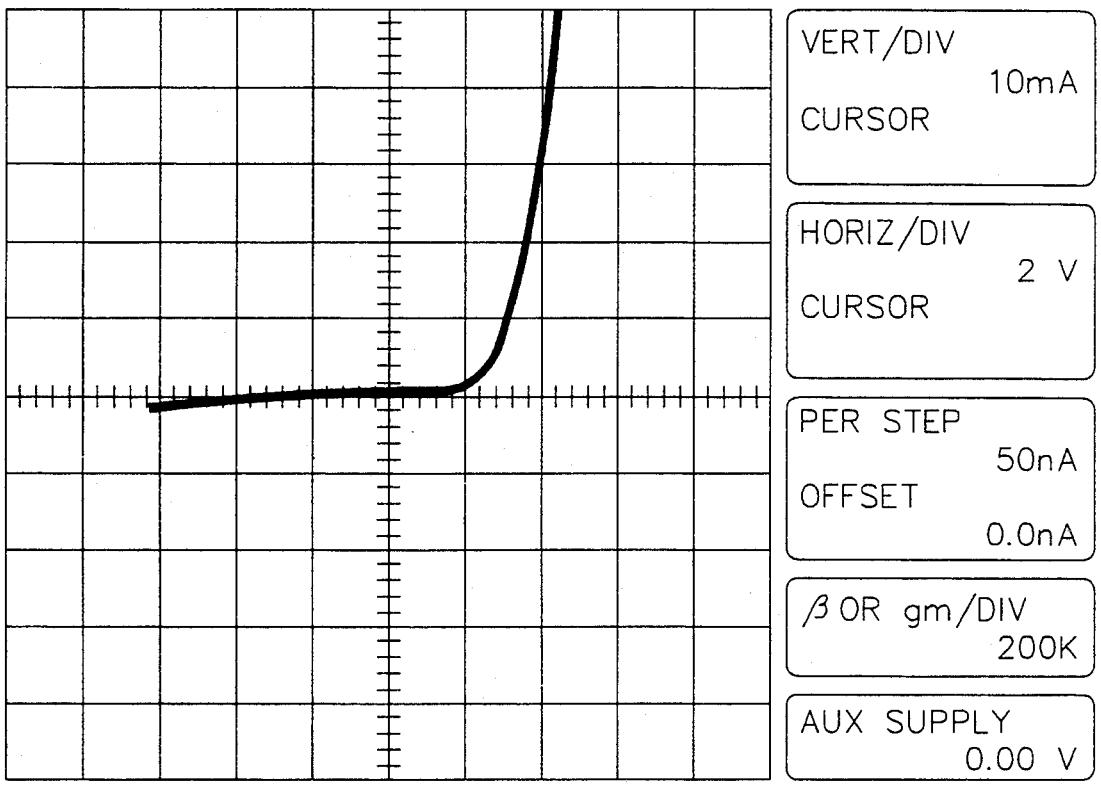

FIG. 10a illustrates the current-voltage relationship of an earlier device which used lithium as the p-type dopant and gold as the electrical contact to the p-type zinc selenide layer. As shown, about 10 V is required to obtain 1 mA current under forward bias conditions for a diode having a cross sectional area of $10^{-3}$ cm$^2$. FIGS. 10b–10d illustrate diodes including zinc selenide and mercury selenide layers, according to the present invention. As shown, these diodes of cross-sectional area $10^{-3}$ cm$^2$ turn on at a much lower voltage (2.1 V to obtain 1 mA, 3.2 V to obtain 10 mA and 4.4 V to obtain 50 mA as shown in FIGS. 10b–10d, respectively). This dramatic increase in current at a given voltage compared with earlier diodes provides clear evidence that the ohmic contact of the present invention is effective.

Figure 11:
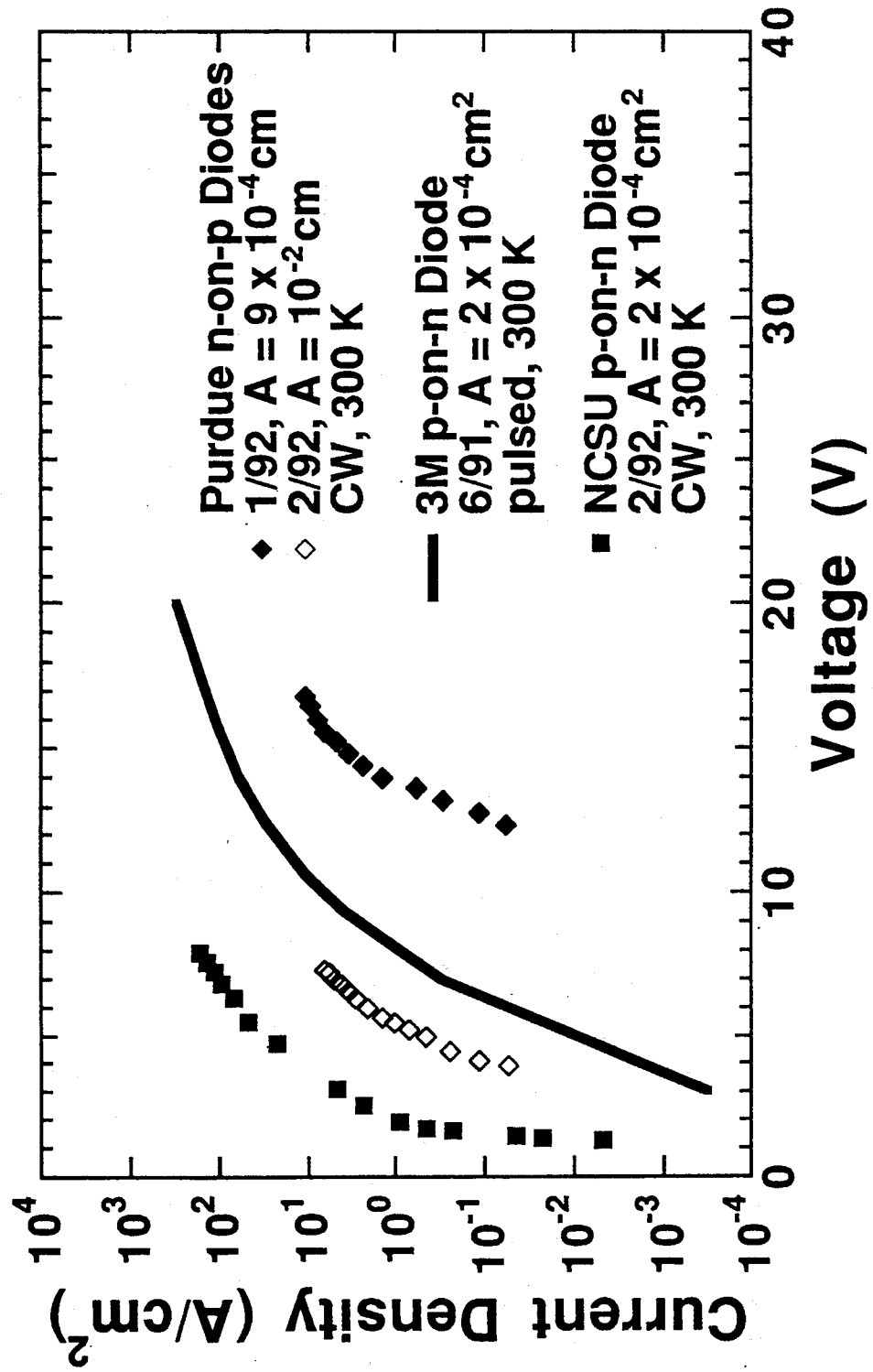
FIG. 11 is a graphical illustration of the current-voltage relationship among known light emitting diodes and light emitting diodes fabricated according to the present invention.

FIG. 11 graphically compares the diodes fabricated according to the present invention as described above ("NCSU p-on-n diodes 2/92") with those produced by 3M and Purdue. As shown, the p-on-n diodes of the present invention are substantially improved from those reported by 3M. Indeed, the diodes of the present invention are substantially better than the Purdue results for n-on-p diodes, particularly when diodes of similar cross-sectional areas are compared.

Figure 12:
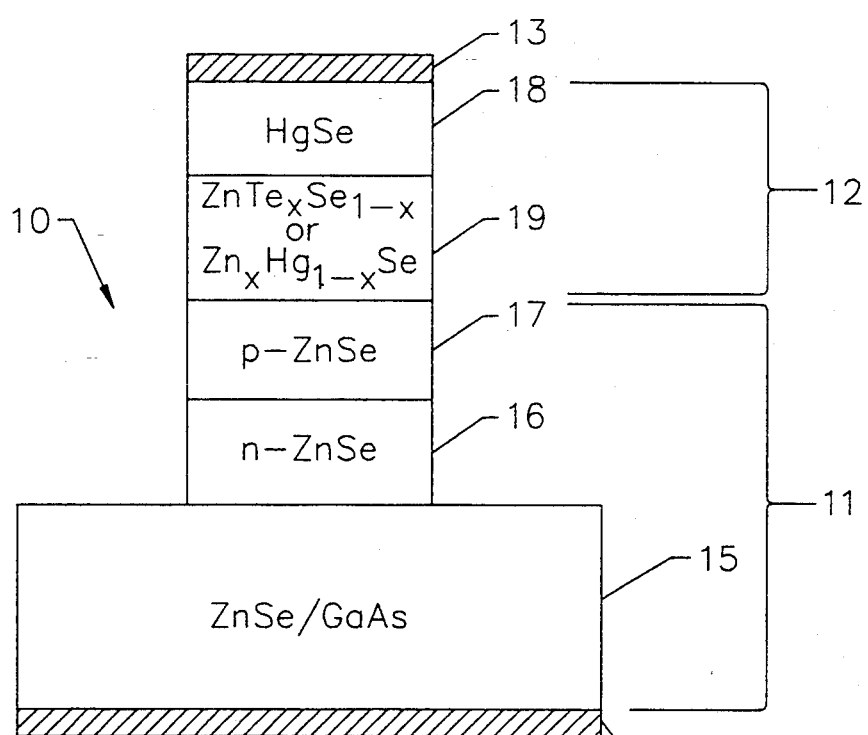
FIG. 12 is a cross-sectional illustration of a second embodiment of the present invention.

Referring now to FIG. 12, a second integrated heterostructure 20 is shown which includes a further improved ohmic contact from that of FIG. 1. As shown in FIG. 12, the optical heterostructure 11 is identical to that of FIG. 1. However, the electrical heterostructure comprises a layer of zinc mercury selenide ($Zn_xHg_{1-x}Se$) 19 or zinc telluride selenide ($ZnTe_xSe_{1-x}$) between the layer of mercury selenide 18 and the p-type zinc selenide layer 17. The layer of mercury selenide 18 and the layer of zinc mercury selenide or zinc telluride selenide 19 provide an improved ohmic contact between p-type zinc selenide layer 17 and conductor 13.

Figure 13:
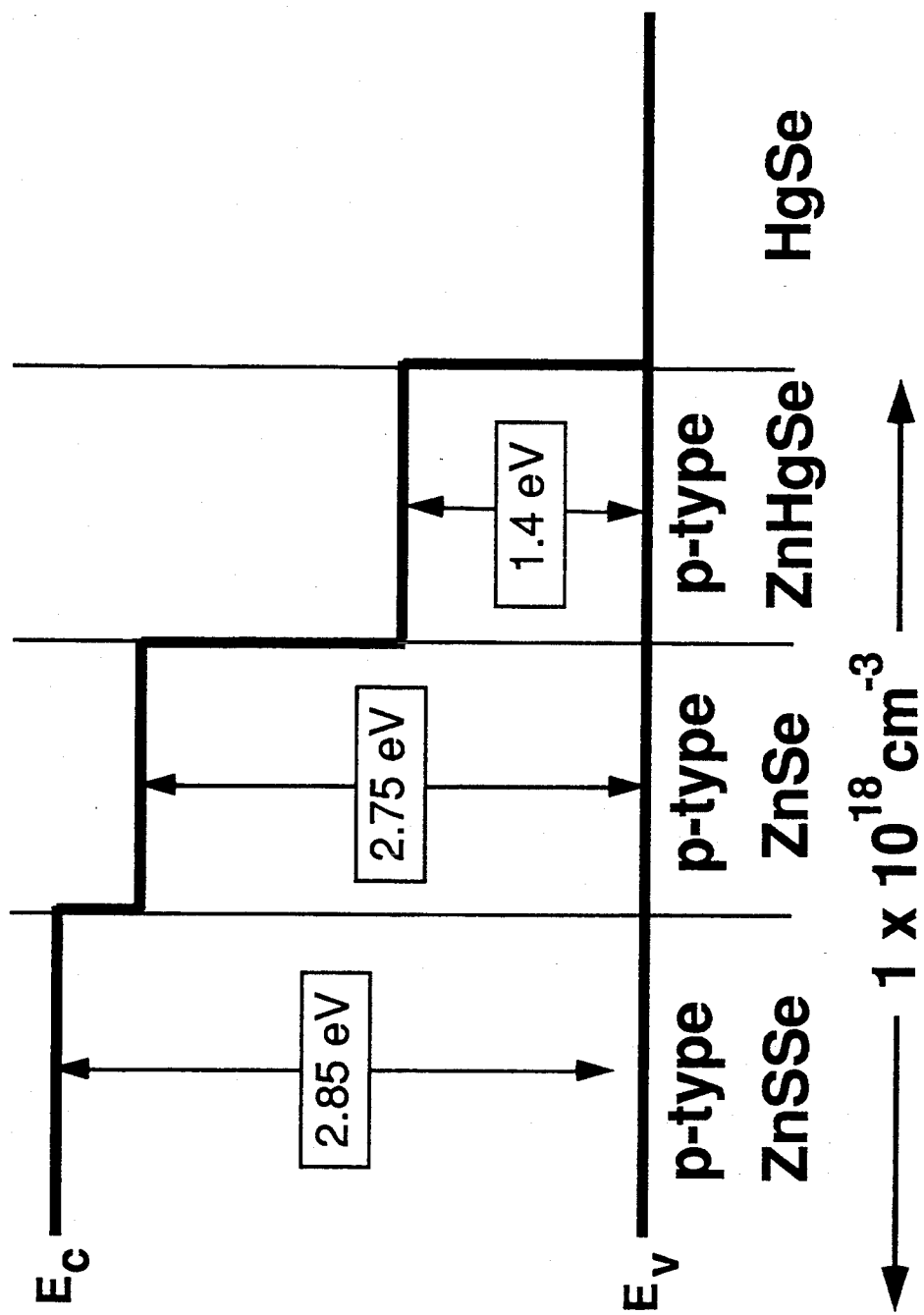
FIG. 13 is an energy band diagram for the device shown in FIG. 12, including a step graded zinc mercury selenide layer.

According to the invention, alternative embodiments of zinc mercury selenide layer or zinc telluride selenide layer 19 can provide an ohmic contact. In one embodiment, zinc mercury selenide layer or zinc telluride selenide layer 19 is a step graded layer having uniform ratio of zinc to mercury or tellurium to selenium respectively, across the entire thickness thereof. A preferred uniform ratio for this layer is about 1:1. FIG. 13 illustrates the energy band diagram for such a step graded zinc mercury selenide layer. Preferably the step graded layer of zinc mercury selenide or zinc telluride selenide is doped p-type with the same doping concentration (e.g. $10^{18}$) as the zinc selenide layer. Nitrogen doping is preferred.

Figure 14:
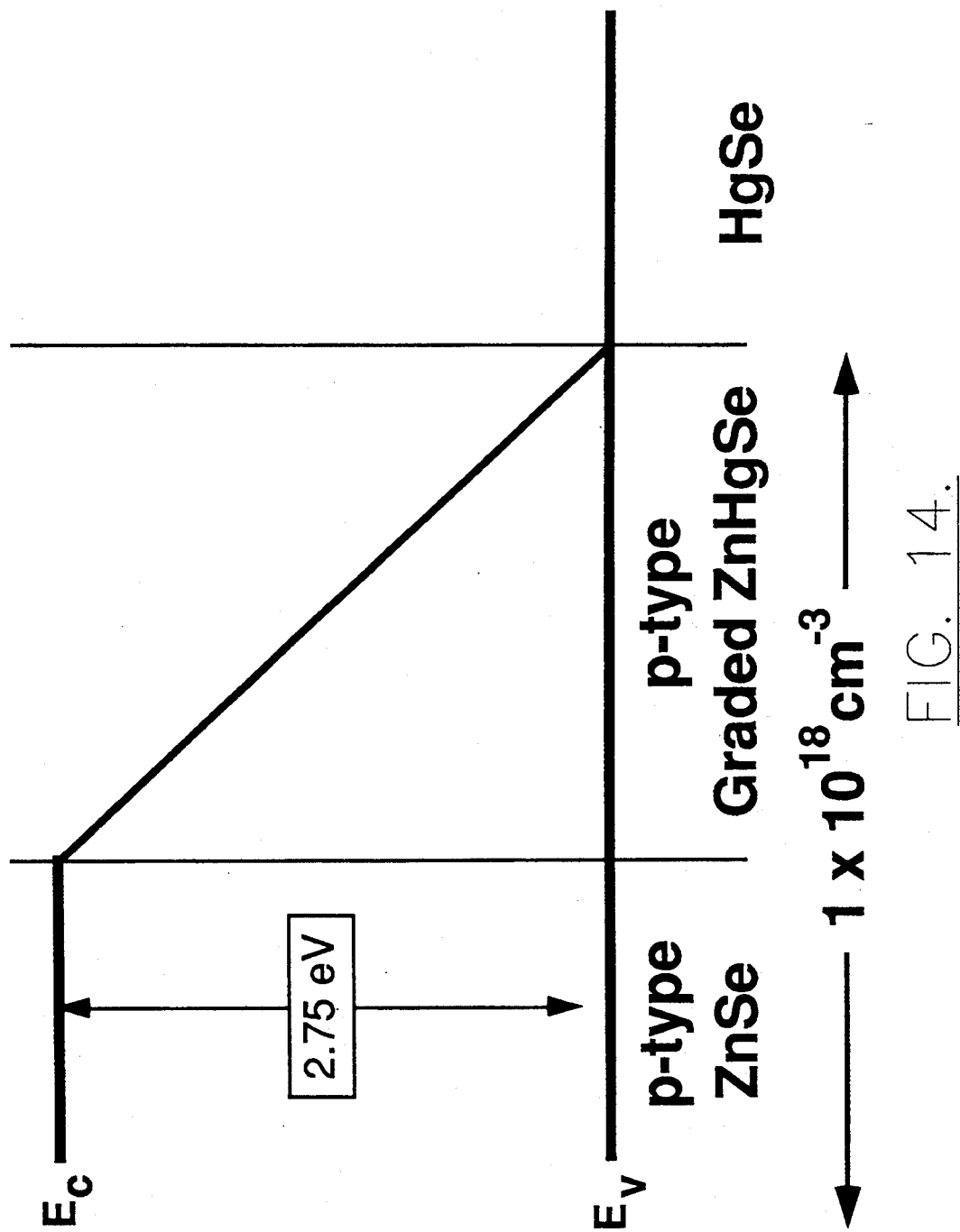
FIG. 14 is an energy band diagram for the device shown in FIG. 12, including a linear graded zinc mercury selenide layer.

Another alternative is shown in FIG. 14 wherein the amount of mercury or tellurium increases linearly across the zinc mercury selenide or zinc telluride selenide layer respectively, from the zinc selenide layer to the mercury selenide layer, to thereby provide a linear graded zinc mercury selenide or zinc telluride selenide layer. Preferably, the linear graded layer of zinc mercury selenide or zinc telluride selenide is doped p-type with the same doping concentration as the p-type zinc selenide (e.g. $10^{18}$).

Figure 15:
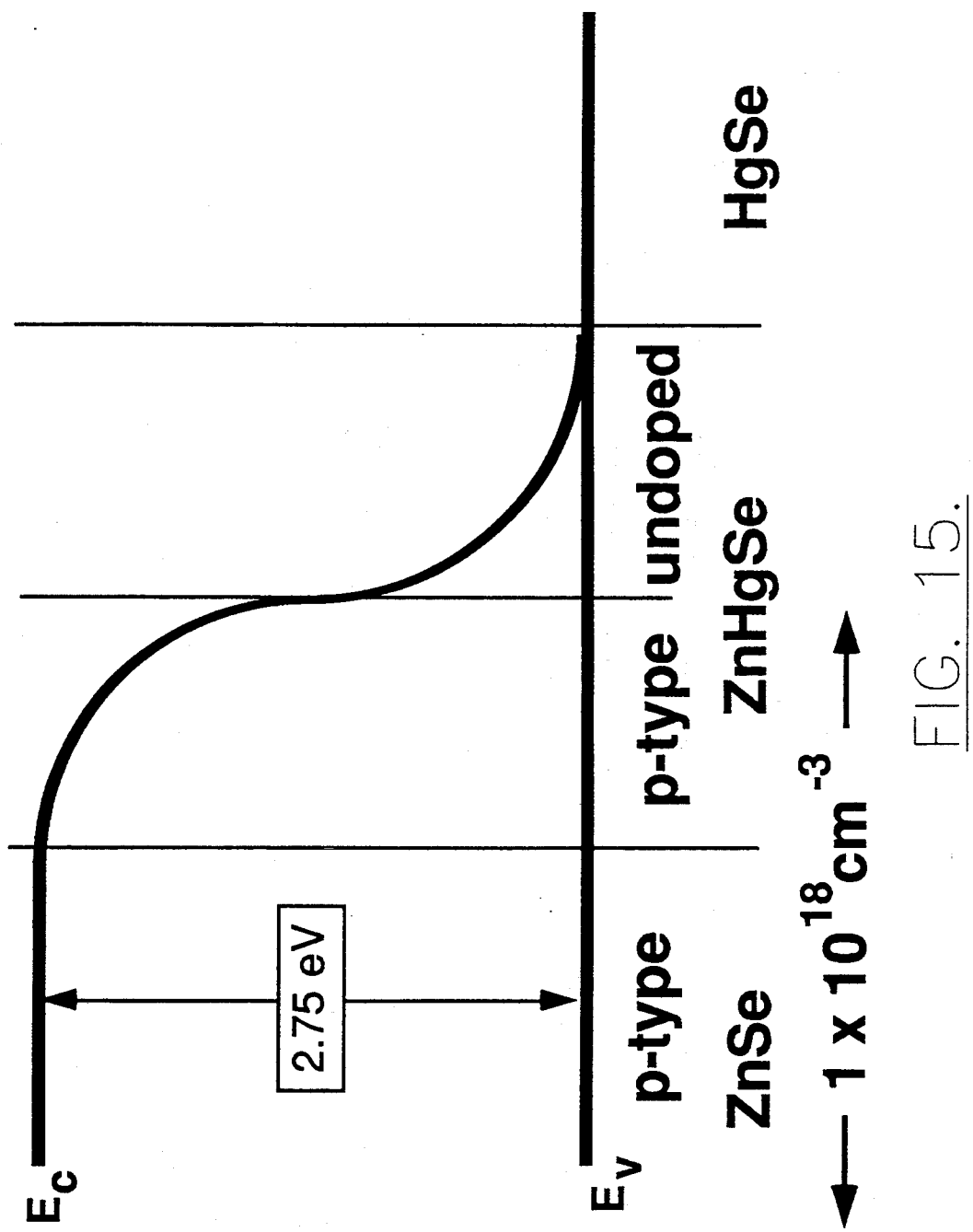
FIG. 15 is an energy band diagram for the device shown in FIG. 12, including a parabolic graded zinc mercury selenide layer.

Referring now to FIG. 15, the most preferred embodiment presently contemplated by the inventor, is a parabolic graded zinc mercury selenide or zinc telluride selenide layer. As further shown in FIG. 15, at least part of the zinc mercury selenide layer or zinc telluride selenide layer is doped p-type, and preferably a portion of the zinc mercury selenide layer or zinc telluride selenide adjacent the zinc selenide layer is doped p-type. Most preferred is a configuration wherein half the thickness of the zinc mercury selenide layer or zinc telluride selenide layer adjacent the zinc selenide layer is doped p-type, with the same doping concentration as the zinc selenide, and with half the layer adjacent the mercury selenide being undoped. In one configuration, the zinc mercury selenide layer or zinc telluride selenide layer is 1200 Å thick, with 600 Å adjacent the zinc selenide layer being doped p-type (preferably with nitrogen) at $10^{18}$ carriers per cubic centimeter to match that of the p-type zinc selenide, and with 600 Å adjacent the mercury selenide being undoped. An optional thin (about 100 Å) layer of p-type zinc telluride (ZnTe) may be formed on the graded zinc telluride selenide layer, to ensure that the interface with the mercury selenide layer is pure ZnTe.

It will be understood by those having skill in the art that in display and other applications it is desirable to provide broad area optical emitters which preferably emit light from the entire top and sides of the emitter. According to the invention, the thickness of mercury selenide layer 18 is limited so that the mercury selenide layer acts as a semitransparent electrode, with a substantial portion of the light emitted from the optical emitter passing through the layer of mercury selenide 18. Preferably, the layer of mercury selenide is less than about 100 Å thick. In this case, although mercury selenide is a semimetal which absorbs throughout the visible and infrared spectral regions, the mercury selenide layer is thin enough so that the light absorption losses are less than about 10%. In addition, the very high conductivity of the mercury selenide layer allows it to act as a semitransparent electrode which covers the entire top of the optical structure. Blue light emitting diodes which emit light at 476 nm over a large surface area with a room temperature efficiency of greater than 0.02% may be obtained using operational voltages of only 4.5 volts to produce 50 mA through the integrated heterostructure.

In order to further reduce the resistance of the large area emitter, conductor 13 may be formed of indium tin oxide, a well known transparent electrode material. The use of indium tin oxide conductor 13 in combination with a mercury selenide layer 18, less than 100 Å thick, enhances the current spreading at the top of the emitter so that numerals or other symbols approaching 1 cm by 1 cm in surface area can be fabricated.

Figure 16A:
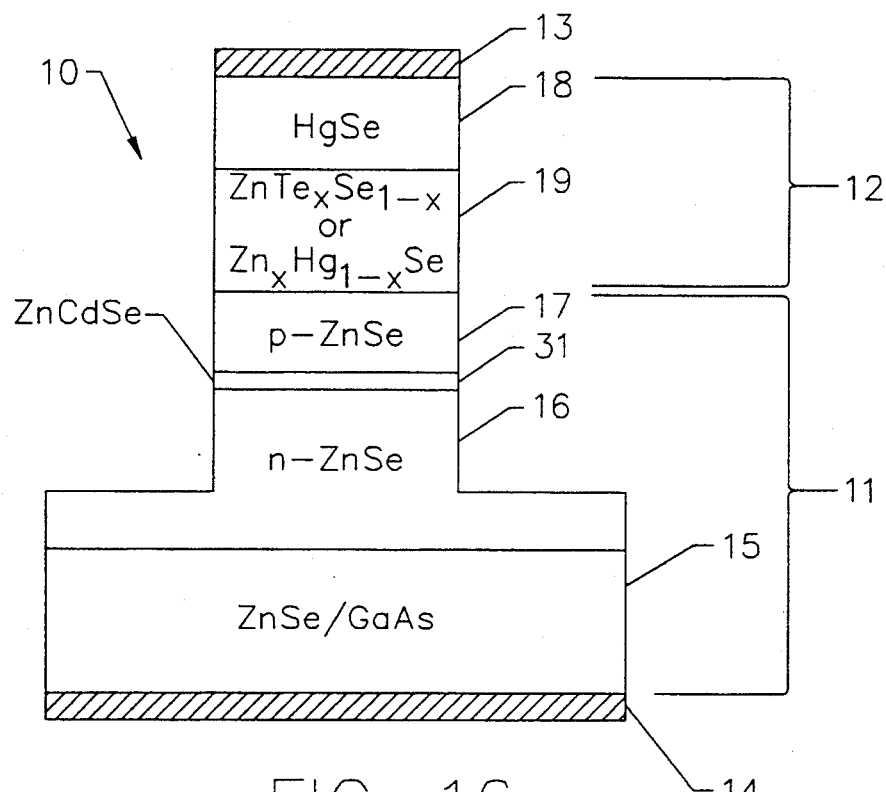
FIGS. 16a–16p are cross-sectional illustrations of alternative combinations of integrated heterostructures according to the present invention.

It will also be understood by those having skill in the art that any of the ohmic contacts 12 of the present invention may be combined with any Group II-VI devices to form an integrated heterostructure device. FIGS. 16a–16p illustrate various combinations.

Figure 16B:
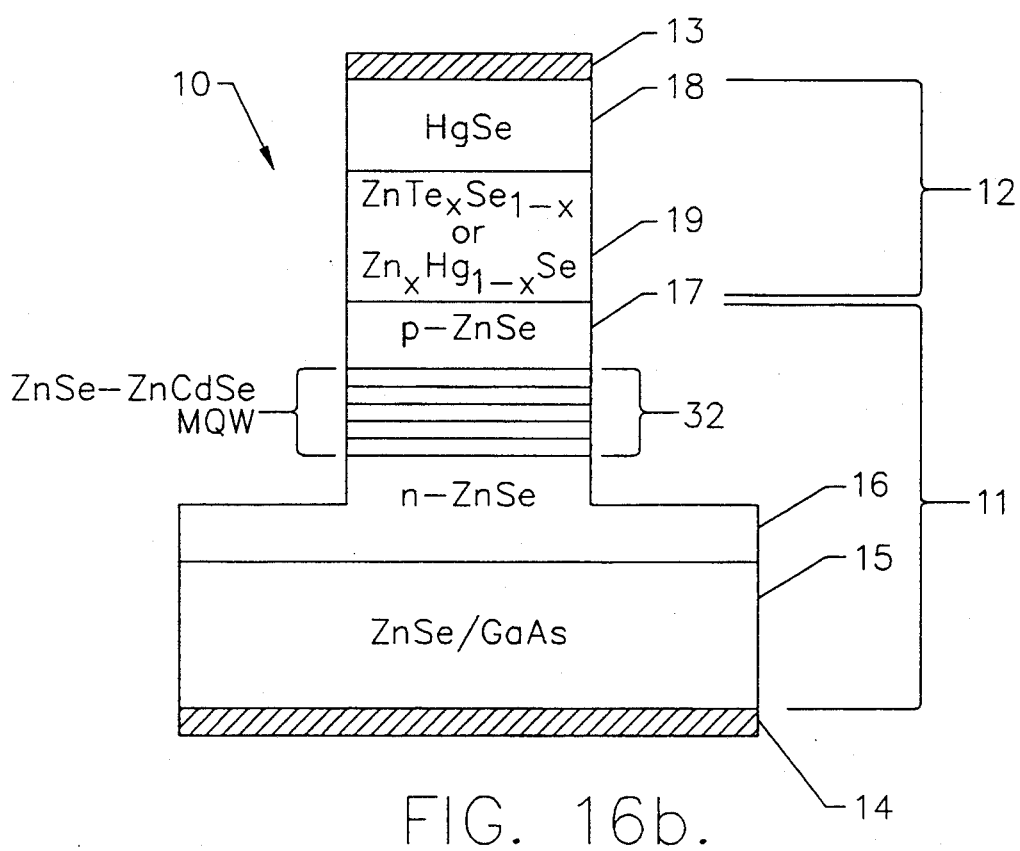
Figure 16C:
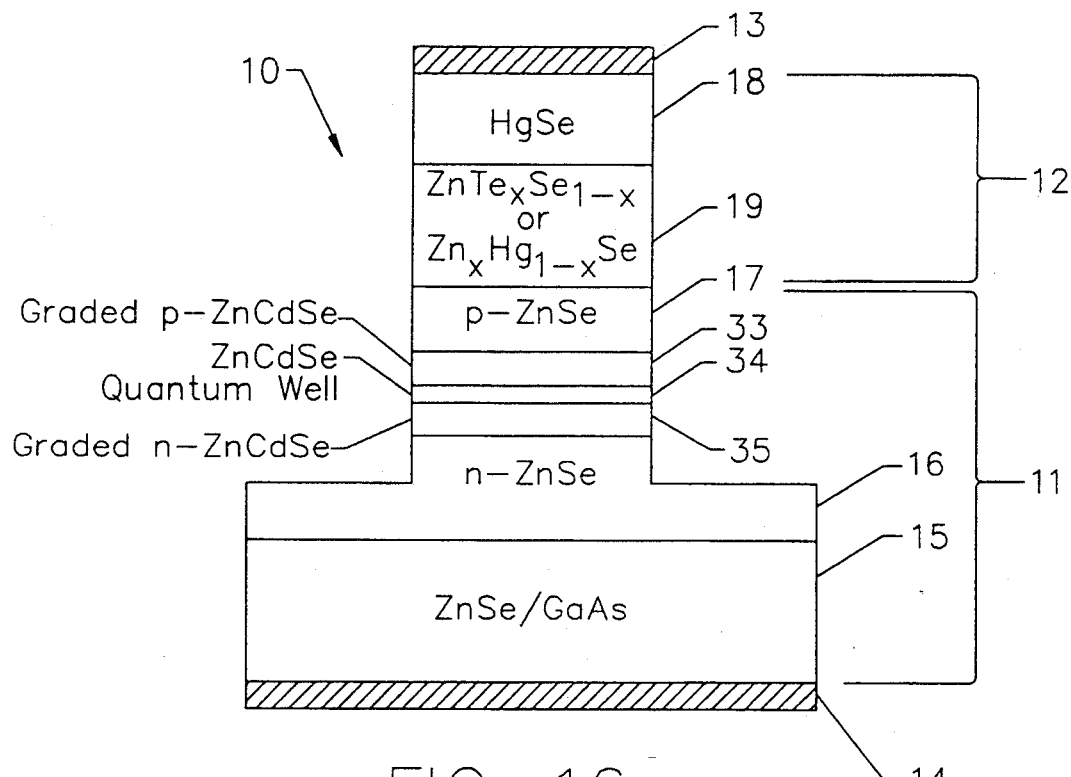
Figure 16D:
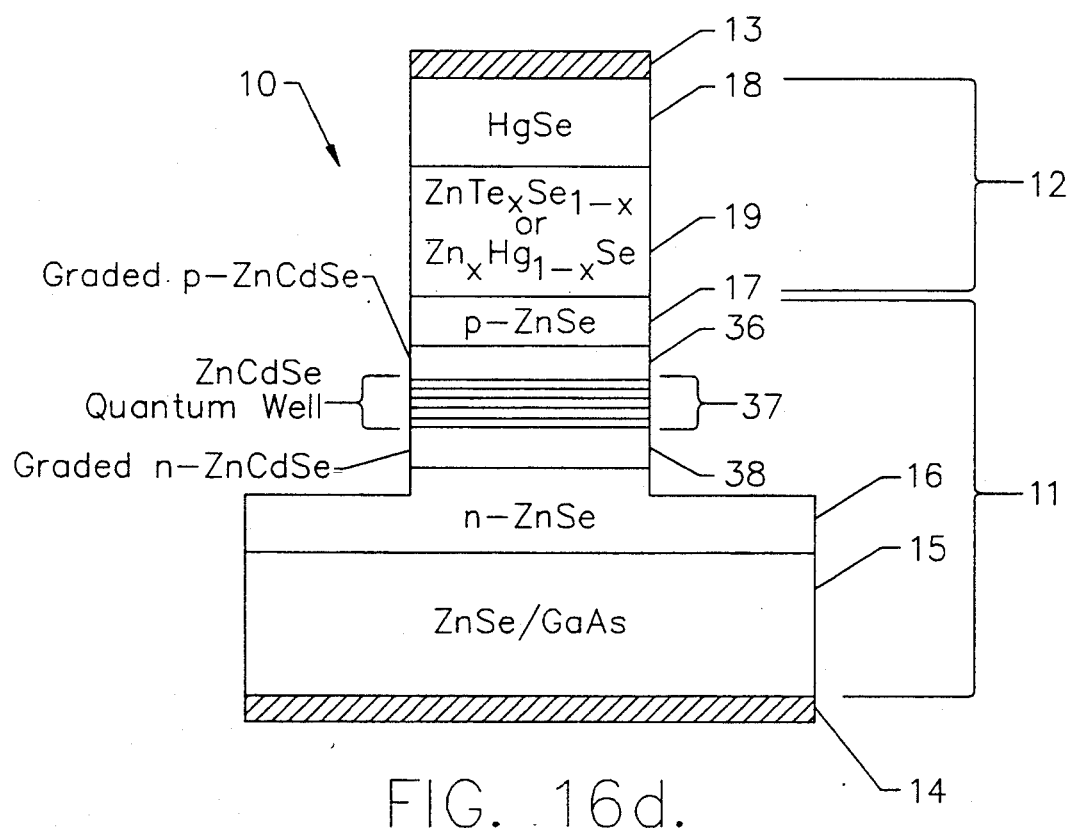

FIGS. 16a–16d illustrate green LEDs. In particular, FIG. 16a illustrates a mesa diode green LED including a ZnCdSe quantum well 31. FIG. 16b illustrates a multiple quantum well (MQW) mesa diode green LED including an MQW 32 of ZnSe and ZnCdSe. FIG. 16c illustrates a GRaded Index Separate Confinement Heterostructure ("GRINSCH") mesa diode green LED including a layer of graded p-type ZnCdSe 33, a ZnCdSe quantum well 34 and graded n-type ZnCdSe 35. FIG. 16d illustrates a GRINSCH-MQW mesa diode green LED including a graded layer of p-type ZnCdSe 36 and a layer of ZnCdSe 37, and a graded layer of n-type ZnCdSe 38.

Figure 16E:
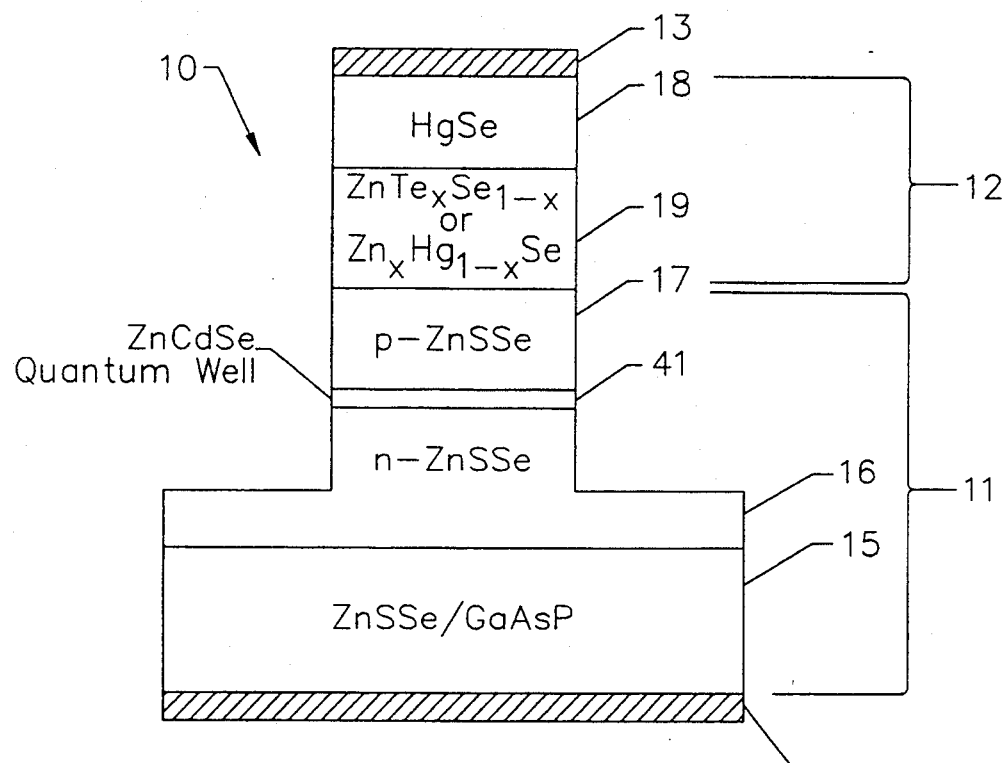
Figure 16F:
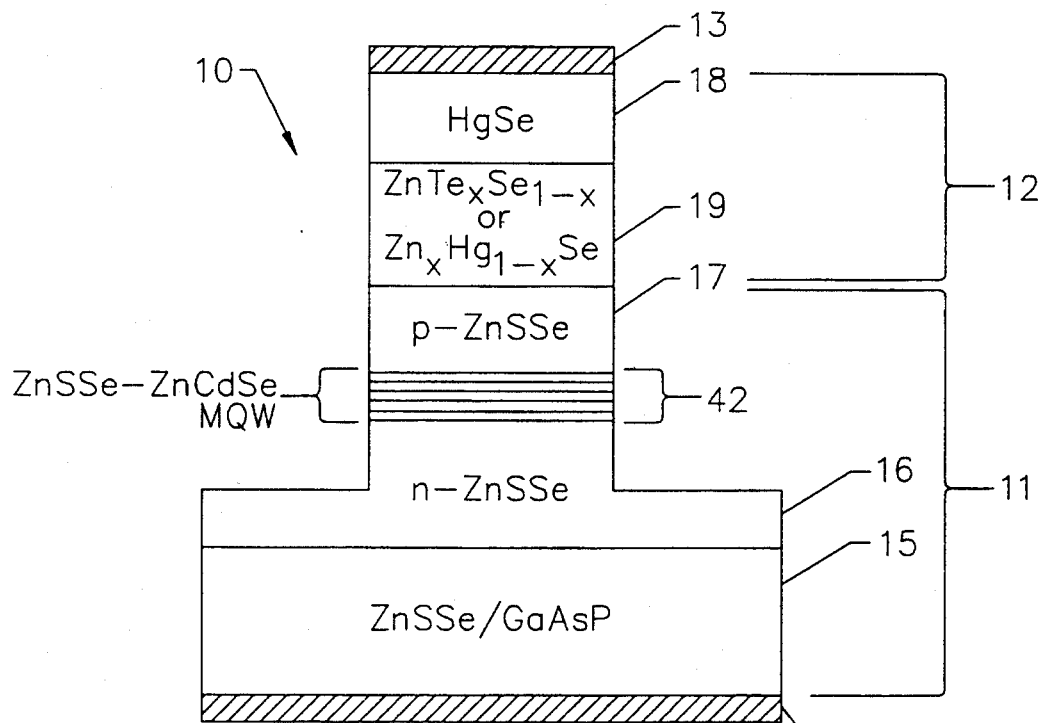
Figure 16G:
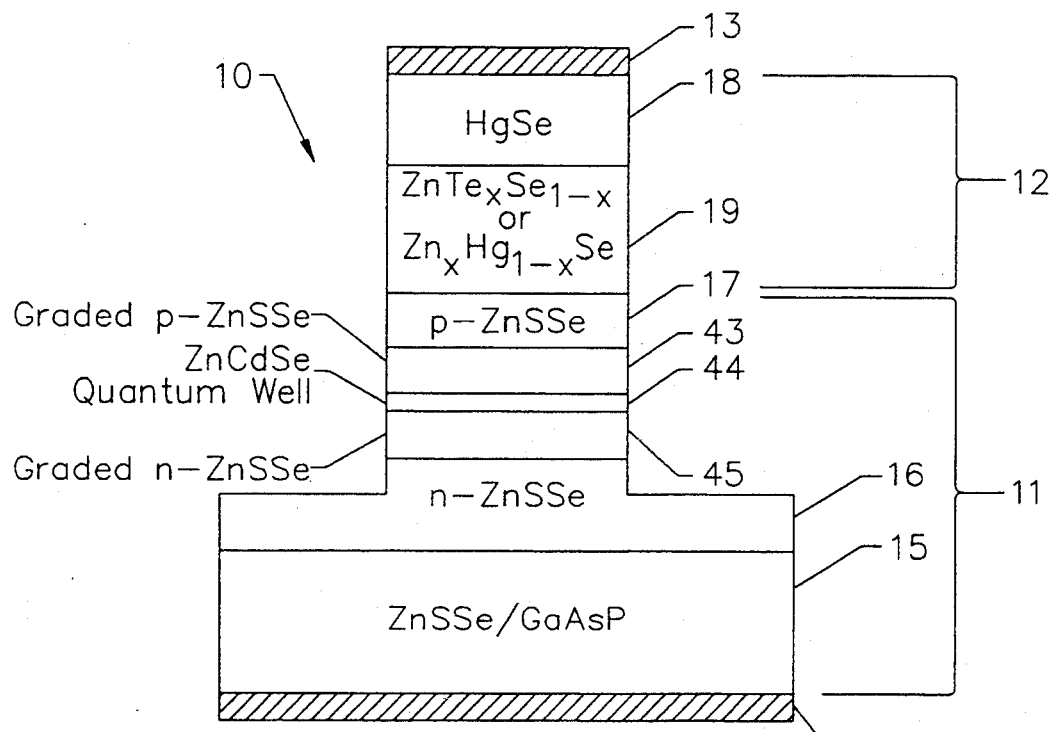
Figure 16H:
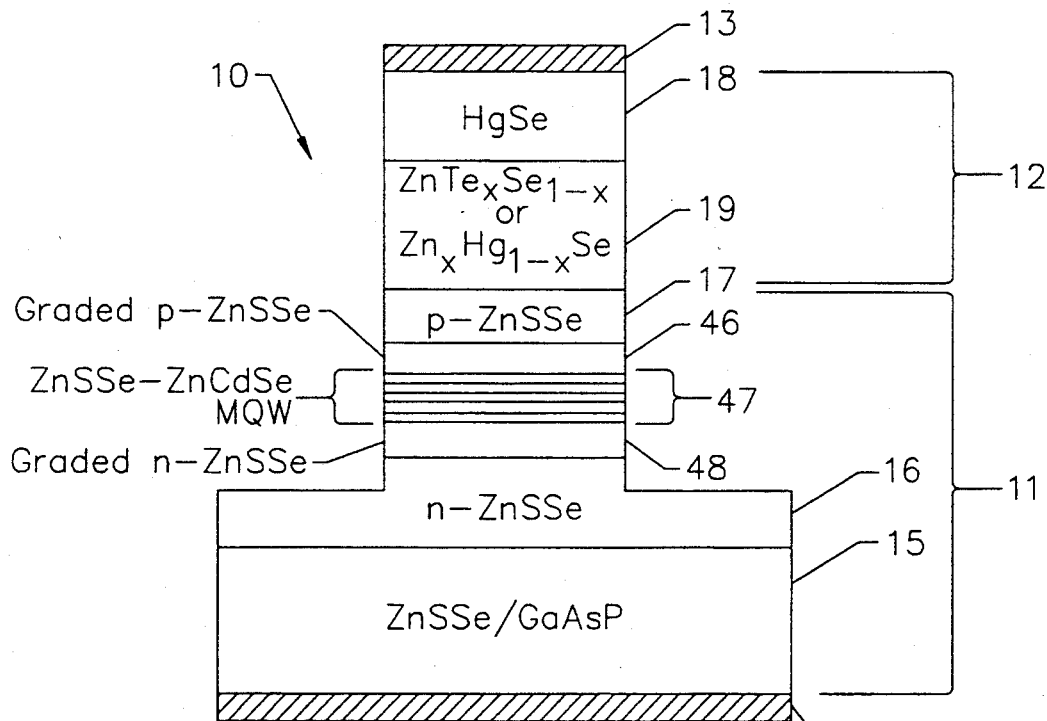
Figure 16I:
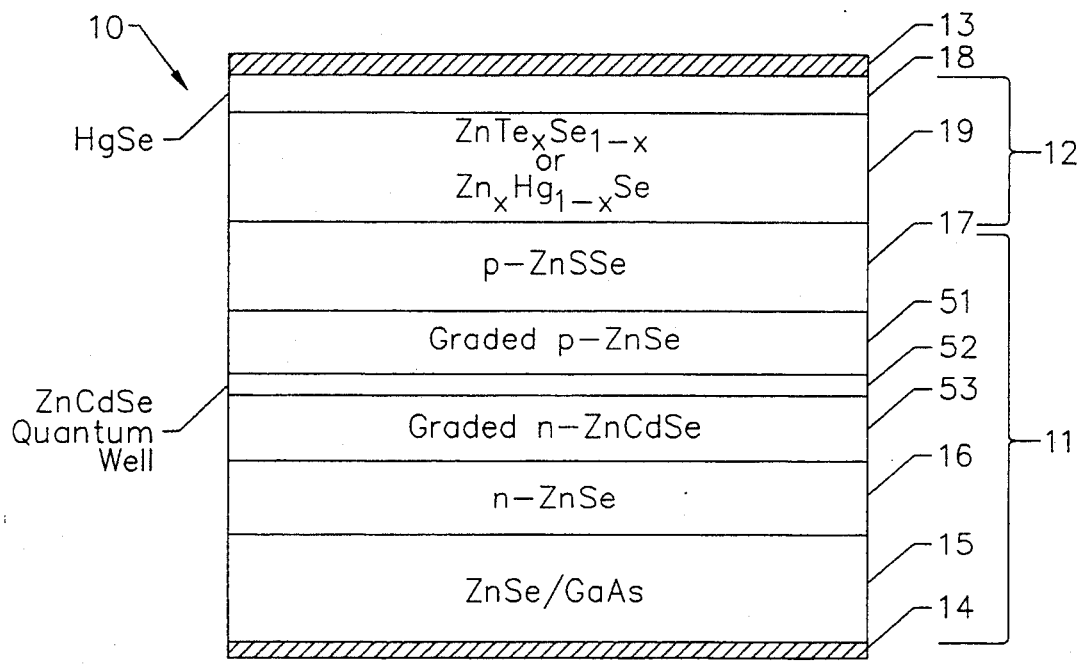

FIGS. 16e–16h illustrate blue LEDs. FIG. 16e illustrates a mesa diode blue LED including p- and n-type layers of zinc sulfur selenide and a zinc cadmium selenide quantum well 41. FIG. 16f illustrates an MQW mesa diode blue LED including an MQW 42 of zinc sulfur selenide and zinc cadmium selenide. FIG. 16g illustrates a GRINSCH mesa diode blue LED including a layer graded p-type zinc sulfur selenide layer 43, a zinc cadmium selenide quantum well 44 and a graded n-type zinc sulfur selenide layer 45. FIG. 16h illustrates a GRINSCH MQW blue LED including a graded layer of p-type zinc sulfur selenide 46, an MQW of zinc sulfur selenide and zinc cadmium selenide 47, and a graded layer of n-type zinc sulfur selenide 48.

Figure 16J:
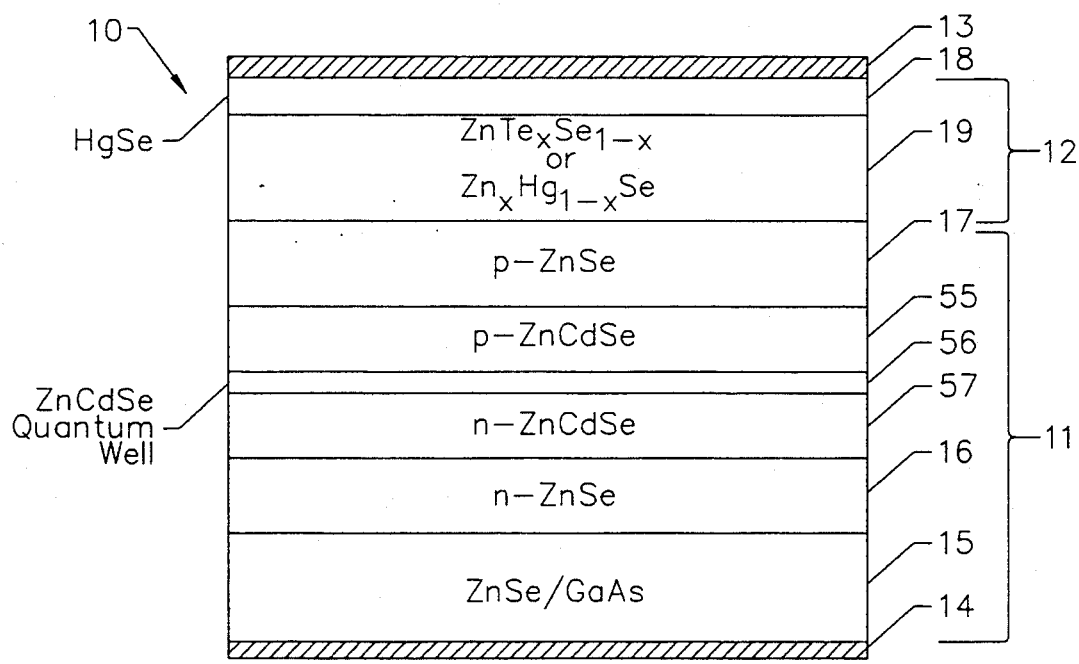
Figure 16K:
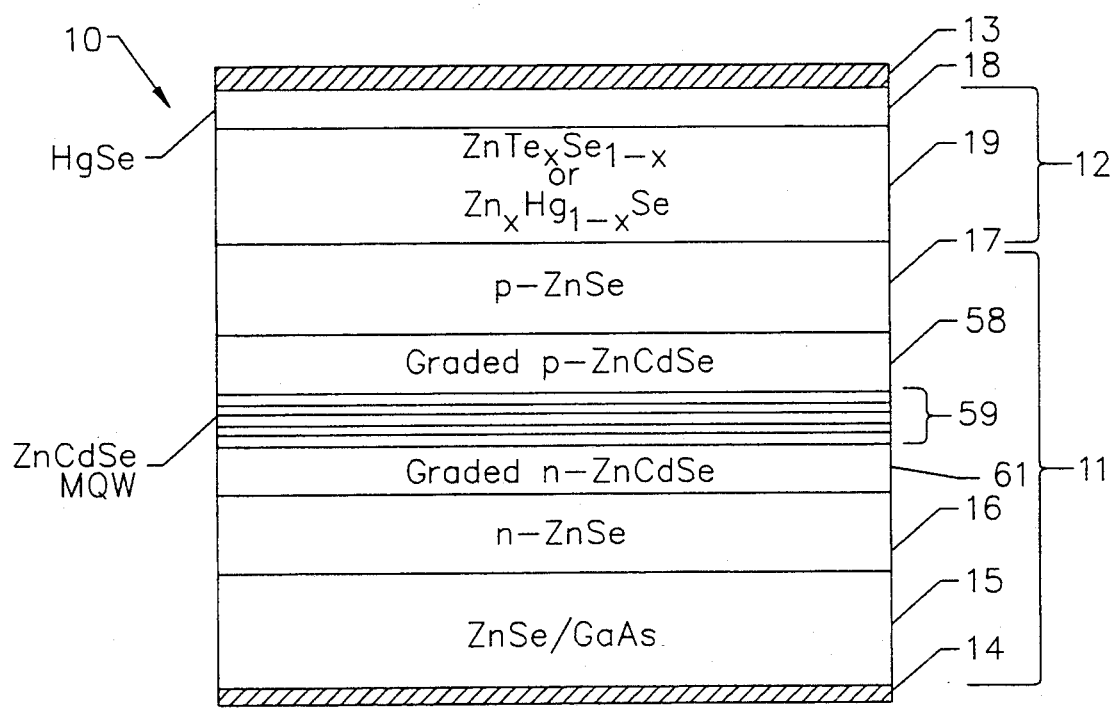
Figure 16L:
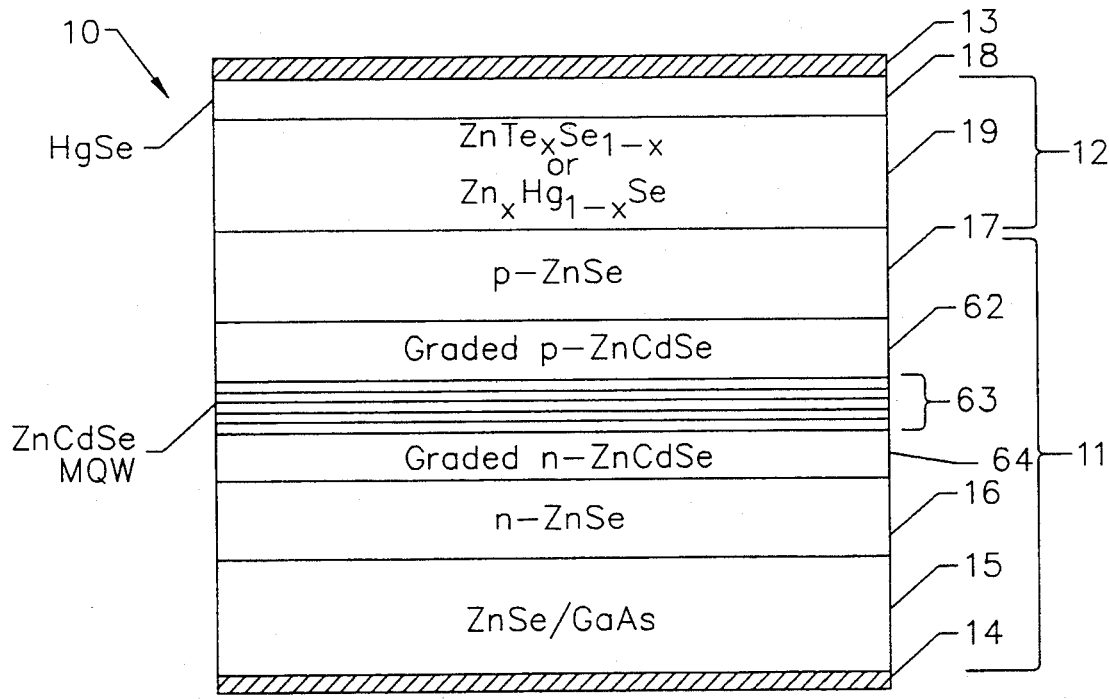

FIGS. 16i–16l illustrate green lasers. FIG. 15i illustrates a GRINSCH green laser, including a graded layer of p-type zinc cadmium selenide 51, a zinc cadmium selenide quantum well 52, and a graded layer of n-type zinc cadmium selenide 53. FIG. 16j illustrates a separate confinement green laser formed by a layer of p-type zinc cadmium selenide 54, a zinc cadmium selenide quantum well 56 and an n-type zinc cadmium selenide layer 57. FIG. 16k illustrates a GRINSCH MQW green laser including a graded layer of p-type zinc cadmium selenide 58, a zinc cadmium selenide MQW 59 and a graded layer of n-type zinc cadmium selenide 61. A separate confinement MQW green laser is shown in FIG. 16l including a p-type layer of zinc cadmium selenide 62, a zinc cadmium selenide MQW 63 and n-type zinc cadmium selenide layer 64.

Figure 16M:
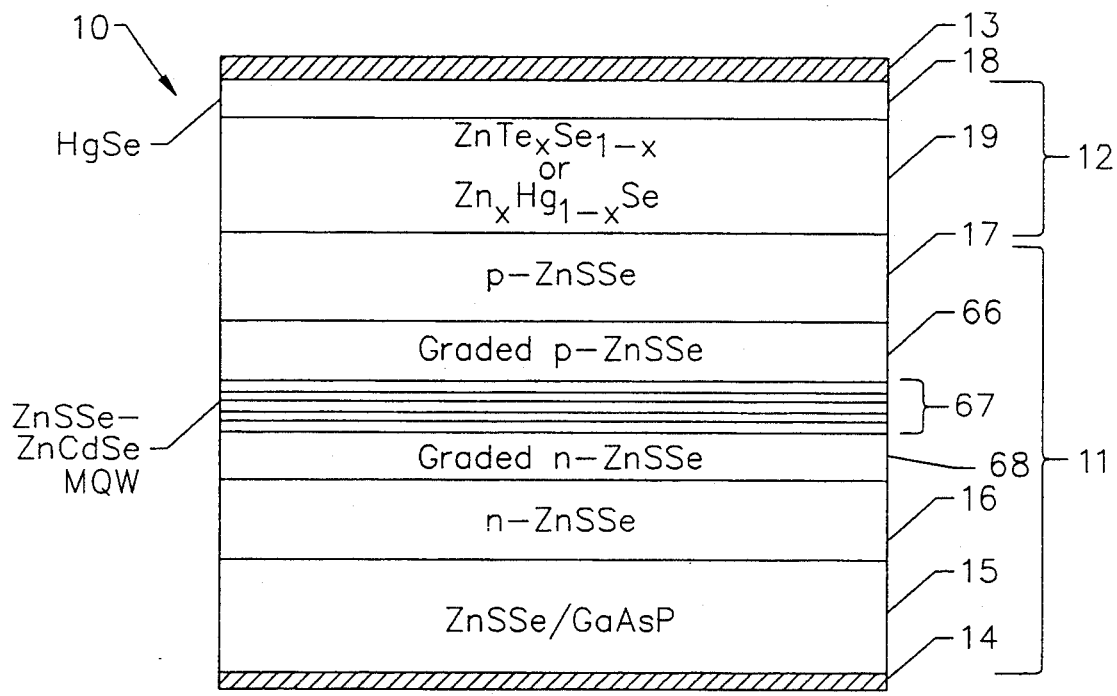
Figure 16N:
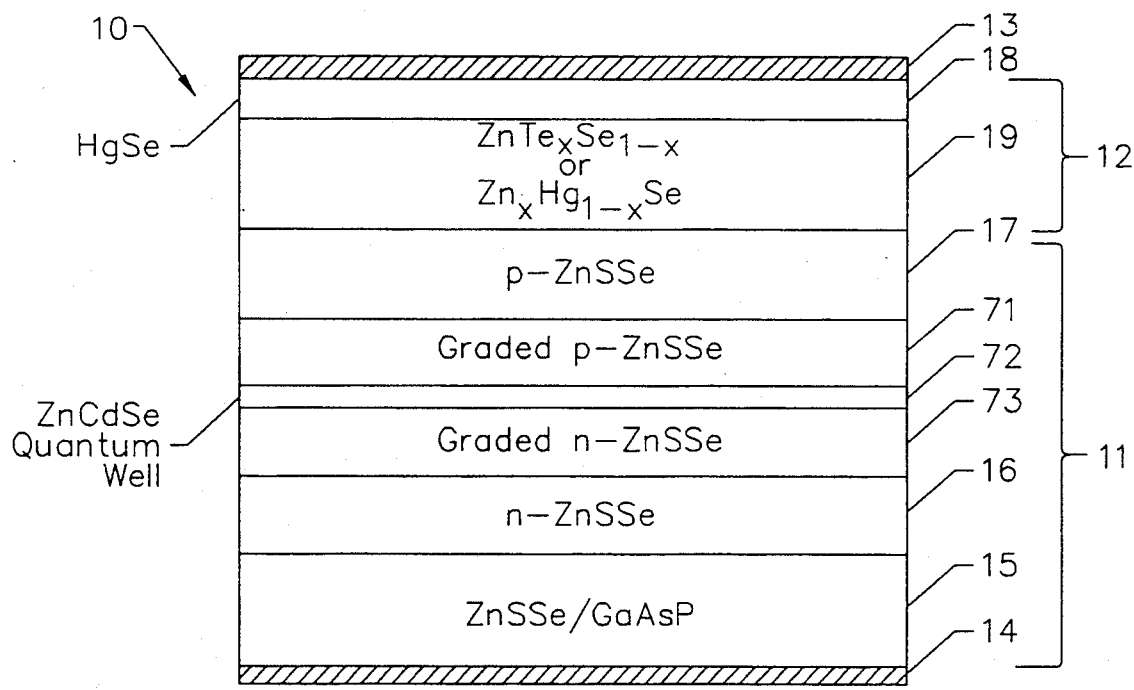
Figure 16O:
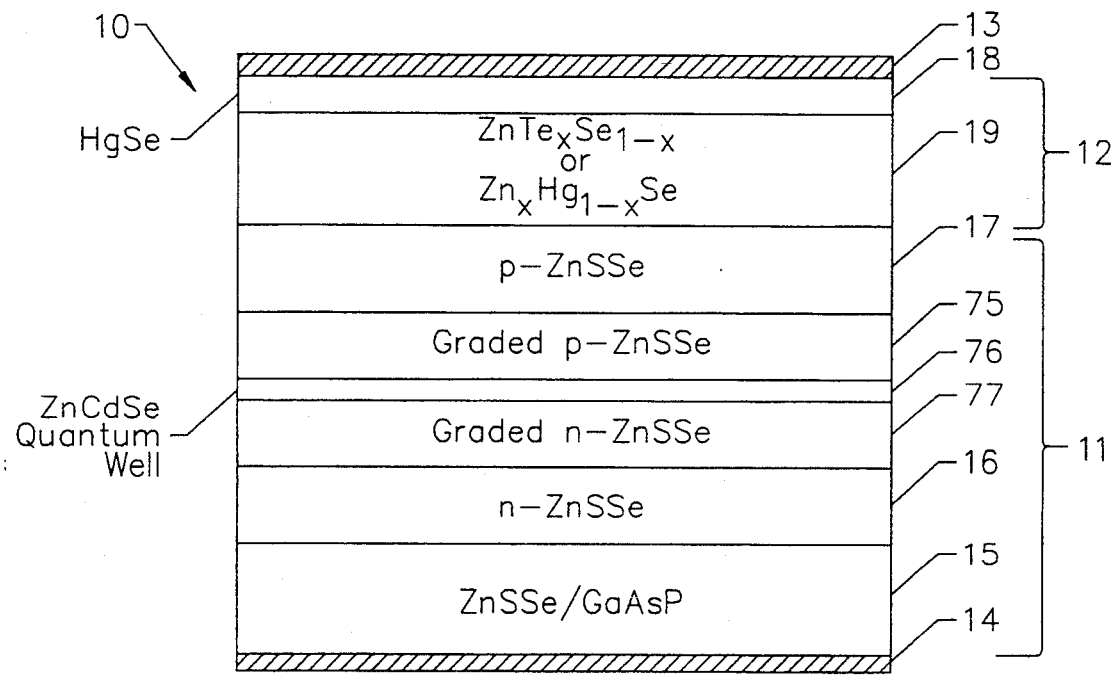
Figure 16P:
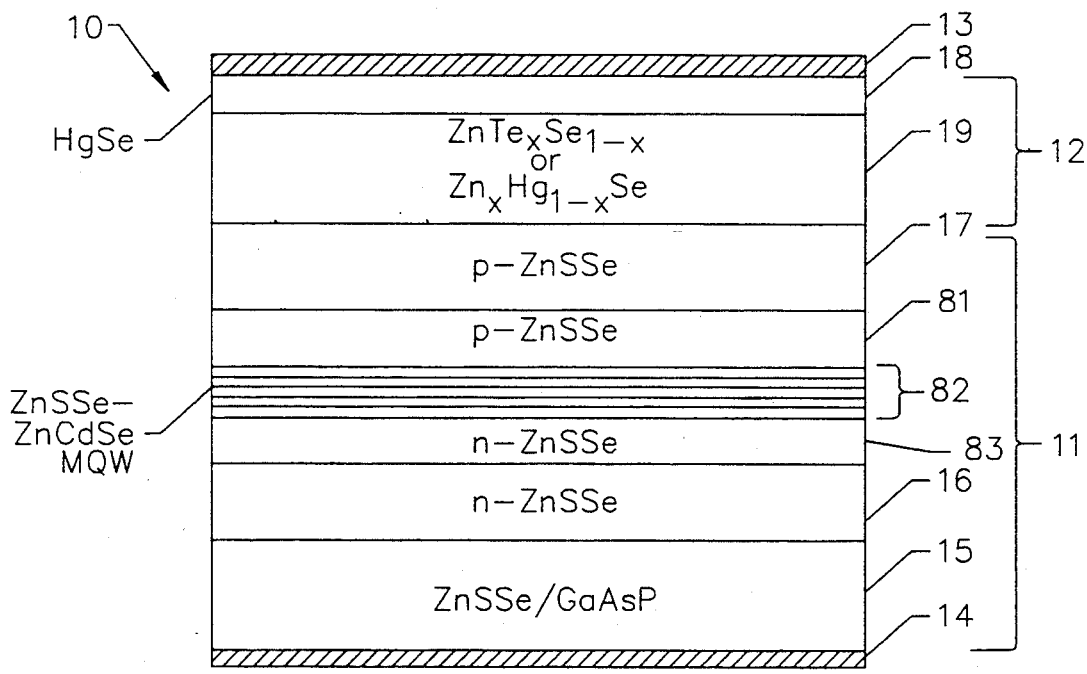

FIGS. 16i–16p illustrate blue lasers. In particular, FIG. 16m illustrates a GRINSCH MQW blue laser formed of graded p-type zinc sulfur selenide layer 66, an MQW 67 of zinc sulfur selenide and zinc cadmium selenide, and a graded layer of n-type zinc sulfur selenide 68. FIG. 16n illustrates a GRINSCH blue laser including graded p-type zinc sulfur selenide layer 71, a zinc cadmium selenide layer quantum well 72 and a graded n-type zinc sulfur selenide layer 73 FIG. 15o illustrates a separate confinement blue laser including a p-type layer of zinc sulfur selenide 75, a zinc cadmium selenide quantum well 76 and an n-type zinc sulfur selenide layer 77. Finally, FIG. 15p illustrates a separate confinement MQW blue laser including a p-type layer of zinc sulfur selenide 81, an MQW of zinc sulfur selenide and zinc cadmium selenide 82, and an n-type layer of zinc sulfur selenide 83.

Each of the structures of FIGS. 15a–15p includes the ohmic contact shown in FIG. 12, including a layer of mercury selenide 18 and a graded zinc mercury selenide layer or zinc telluride selenide layer 19. The ohmic contact of FIG. 1, which includes a mercury selenide layer 18 and is free of a zinc mercury selenide layer 19, may also be used. It will be understood that other configurations of the optical structure 11 may also be used.

It will also be understood that in any of the heterojunctions previously described, band discontinuities can be reduced or eliminated by modulation doping. Modulation doping is a technique which is well known to those having skill in the art, and is described for Group III-V semiconductors in an article by Shupert et al. entitled *Elimination of Heterojunction Band Discontinuities By Modulation Doping*, Applied Physics Letters, Vol. 16, No. 4, January 1992, pp. 466–468.

Techniques for fabricating the ohmic contacts of the present invention will now be described. At present, molecular beam epitaxy (MBE) is the preferred deposition technique for preparing integrated heterostructure devices of Group II-VI compound semiconductors for blue to green light emitter applications. This is because p-type doping is possible using nitrogen excited in a remote-plasma-enhanced MBE source, such as the model MPD21 marketed by Oxford Applied Research, Oxfordshire, England. Organometallic vapor deposition (OMCVD) is a second potential deposition technique for growing integrated heterostructure devices, if p-type doping is developed. At present, p-type doping of zinc selenide and related alloys by OMCVD has not been demonstrated, to the best of the inventor's knowledge.

The integrated heterostructure devices of the present invention may be fabricated using a two chamber MBE deposition system. In the integrated heterostructure including the zinc mercury selenide layer 19, a first deposition chamber may be used exclusively for the deposition of wide bandgap Group II-VI semiconductor layers including zinc selenide, zinc cadmium selenide and zinc sulfur selenide, to grow the optical portion 11 of the integrated heterostructure device according to any of the structures described above or any other Group II-VI optical structure. The sample is then transferred to a second chamber where mercury selenide, or zinc mercury selenide and mercury selenide, is heteroepitaxially formed on the p-type zinc selenide. A second chamber is typically required because of the special requirements for depositing mercury based materials which are necessitated by the extremely high vapor pressure of mercury (about 3 mTorr at room temperature). Accordingly, as is well known to those having skill in the art, special MBE sources, cryoshrouding and other special techniques may need to be employed.

Figure 17:
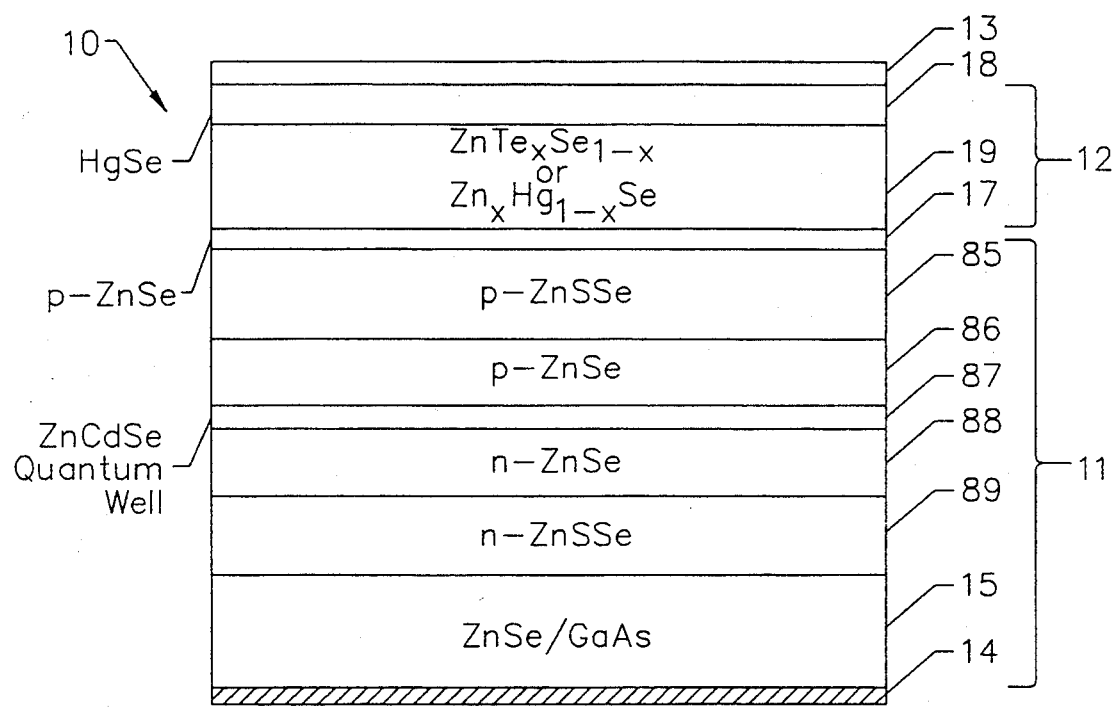
FIG. 17 illustrates another integrated heterostructure according to the present invention.

A detailed process for forming a separate confinement green laser having an ohmic contact using zinc mercury selenide according to the present invention will now be described. The laser structure is shown in FIG. 17 and includes an optical heterostructure 87 comprising a zinc cadmium selenide quantum well 87 between p- and n-type zinc selenide layers 86 and 88, respectively, which are placed between p-and-n zinc sulfur selenide layers 85 and 89, respectively. The optical heterostructure 11 is formed on substrate 15 and includes a top layer 17 of p-type zinc selenide. The ohmic contact heterostructure comprises a layer of graded zinc mercury selenide 19 and a layer of mercury selenide 18 between metal electrode 13 and p-type zinc selenide layer 17.

Conventional substrate preparation processes are used to form an n+ gallium arsenide or zinc selenide substrate 15. Epitaxial growth of the p-on-n heterostructure is initiated at a substrate temperature of 220°-260° C. Chlorine, in the form of the solid zinc chloride, is presently the preferred n-type dopant for the n-type zinc sulfur selenide layer 89 and the n-type zinc selenide optical confinement layer 88. Doping levels for layers 88 and 89 should be about $10^{18} cm^{-3}$. The zinc cadmium selenide quantum well 87 is then deposited, followed by the p-type zinc selenide layer 86 and the p-type zinc sulfur selenide layer 85.

Two techniques may be used to effectively form layers 17, 18 and 19 on layer 85. A first technique transfers the already completed structure into a second chamber under ultrahigh vacuum, using commercially available ultrahigh vacuum interlocking systems or a portable ultrahigh vacuum wafer transfer device. Alternatively, a second technique avoids the need to transfer the optical heterostructure to a second deposition chamber under ultrahigh vacuum by forming a thin overcoat layer, for example selenium, on the structure.

Figure 18A:
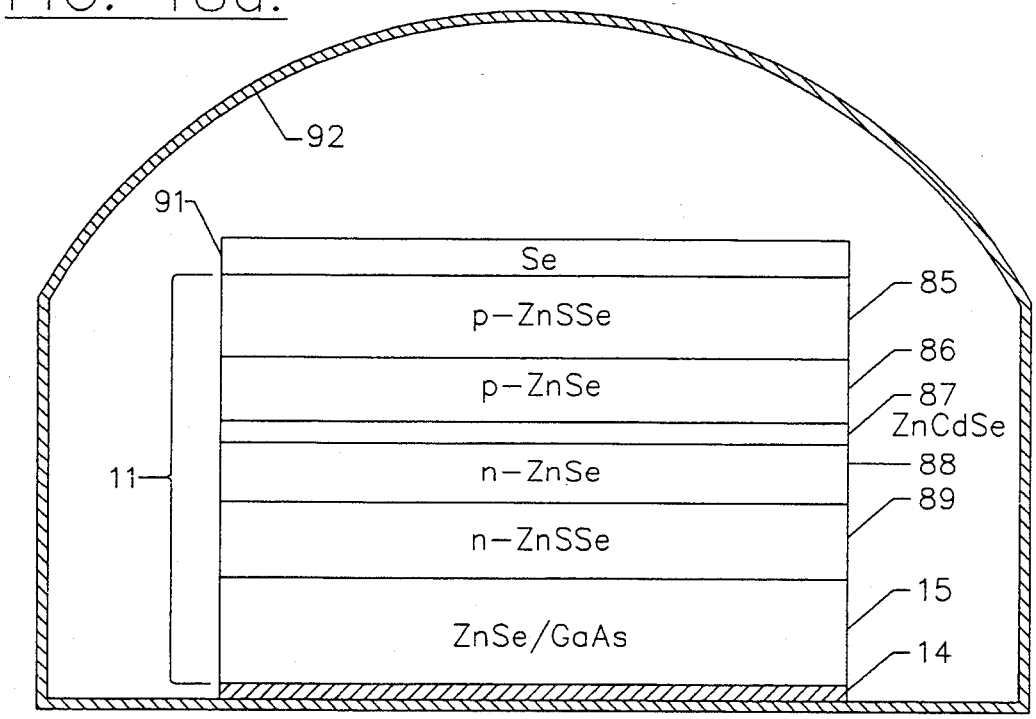
FIGS. 18a and 18b illustrate steps for forming the integrated heterostructure of FIG. 17 according to the present invention.
Figure 18B:
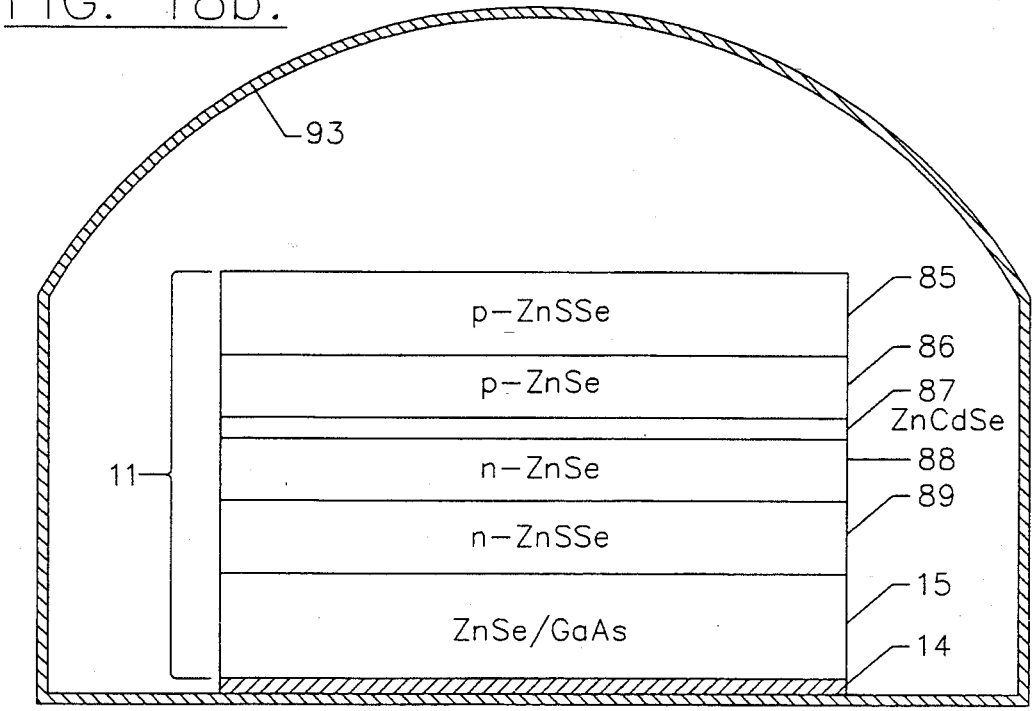

FIGS. 18a and 18b illustrate the use of the selenium overcoat layer. Referring to FIG. 18a, a thin (e.g. about 0.1 μm) layer of selenium 91 may be formed in the first chamber 92 after the deposition sequence described above. The selenium layer deposition may take place at room temperature. Then, the sample can be removed from the first chamber 92 and inserted into a second chamber 93 for mercury based heterostructure growth. In the second chamber 93, the selenium layer 91 may be evaporated by heating the substrate at 300° C. for several minutes just prior to mercury based film growth to obtain the structure of FIG. 18b.

Once the sample in chamber 93 is ready for deposition, a thin (approximately 200 Å) p-type layer of zinc selenide 17 is deposited followed by a graded p-type zinc mercury selenide region 19, and a thin (approximately 200 Å) layer of mercury selenide 18. The exact thickness of the layers is not critical. Preferably, at least part or all of the graded zinc mercury selenide layer is doped p-type to effectively eliminate band discontinuities. At present, nitrogen from a remote plasma source is the preferred p-type dopant. During deposition of the $Zn_xHg_{1-x}Se$ graded layer, in which the x value is graded from x=1 to x=0, the substrate temperature is preferably reduced from about 220°-260° C. initially to about 100° C. in order to effectively incorporate the mercury into the graded zinc mercury selenide layer 19. Zinc and selenium fluxes must also be adjusted for proper growth of the zinc mercury selenide layer. If this adjustment is not done, practically all of the mercury reevaporates and grading of the layer does not occur. The final mercury selenide layer 18 is then deposited at about 100° C.

Figure 19A:
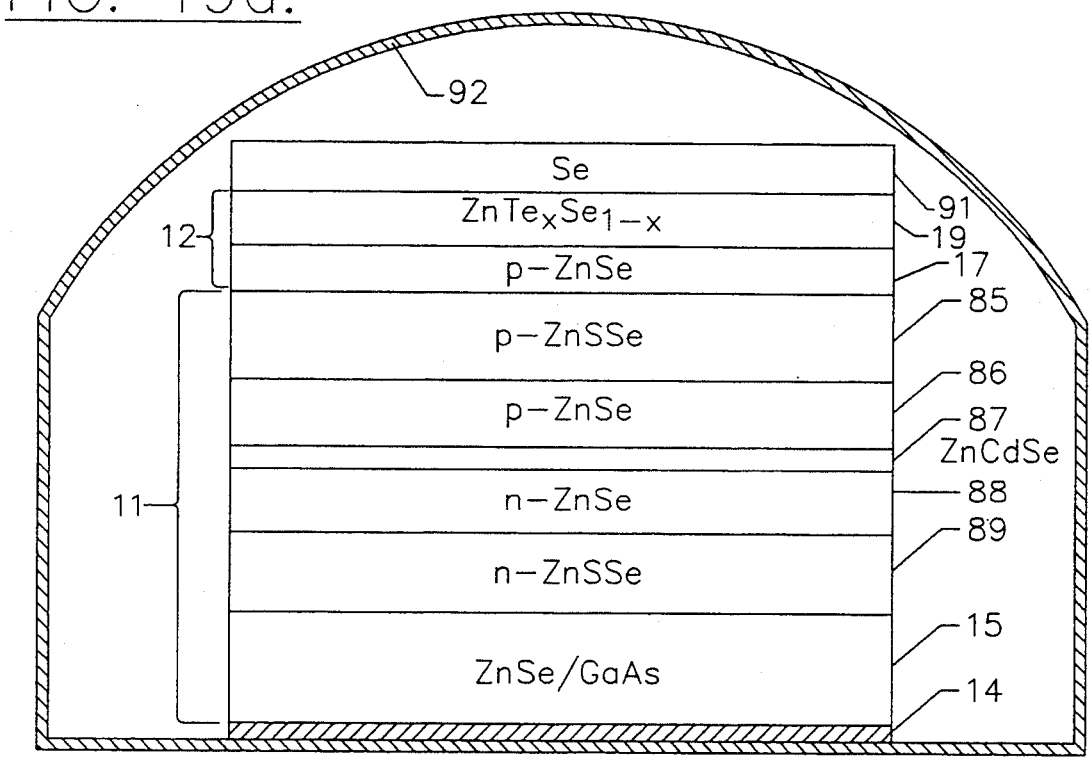
FIGS. 19a and 19b illustrate alternative steps for forming the integrated heterostructure of FIG. 17 according to the present invention.
Figure 19B:
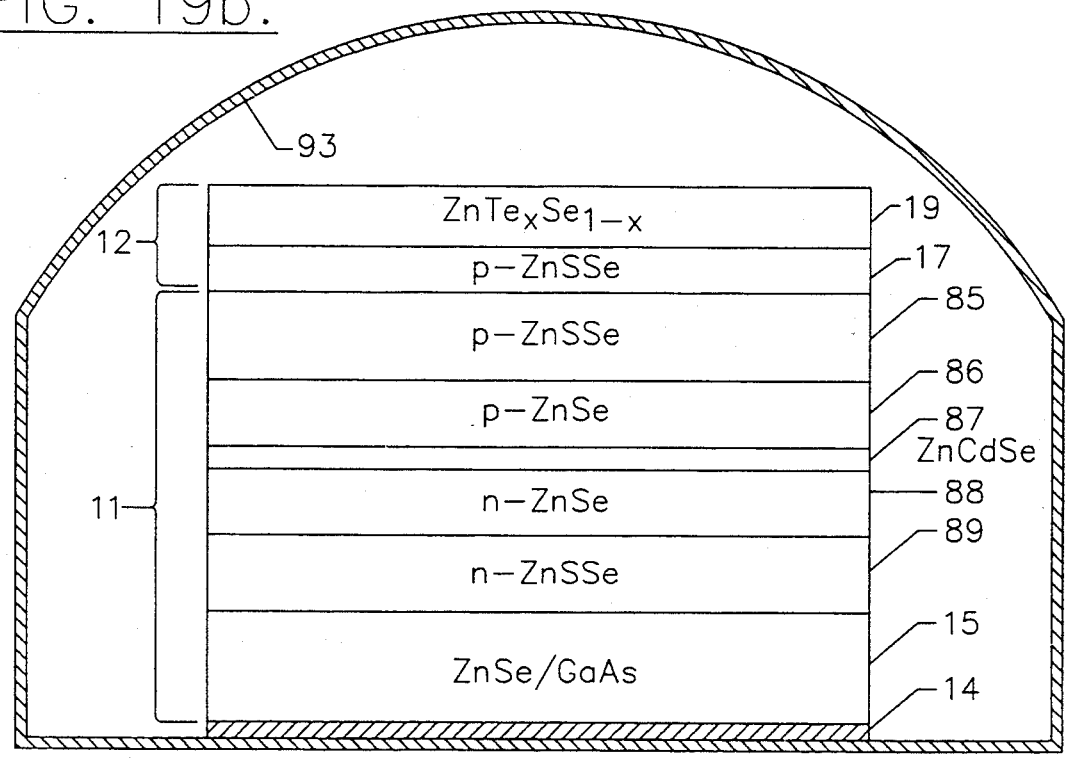

FIGS. 19A and 19B illustrate a two chamber process using a selenium overcoat layer to form an integrated heterostructure device including a zinc telluride selenide layer 19. Referring to FIG. 19A, the optical heterostructure 11 and p-type zinc selenide layer 17 are fabricated in first chamber 92 as was already described in FIG. 18A. Then, zinc telluride selenide layer 19 is grown in first chamber 92 by continuing growth at about 250° C. A graded layer of zinc telluride selenide that is doped p-type with nitrogen from the plasma source is grown by decreasing the temperature of the selenium MBE source oven under computer control while increasing the source temperature of the tellurium MBE source oven. In this way, a p-type graded layer which initially is composed of zinc selenide and finally is composed of zinc telluride is prepared. A preferred thickness of between about 500–1500 Å is grown. The final fluxes may be maintained for an additional short time period to form an optional thin layer (about 100 Å) of p-type zinc telluride. Additional growth of zinc telluride ensures a pure zinc telluride interface with the mercury selenide layer formed thereon.

Following deposition of the zinc tellurium selenide layer 19, a capping formed as was already described in connection with FIG. 18A. The selenium capped structure is then transferred to the second MBE chamber 93 as shown in FIG. 19B. As was already described in connection with FIG. 18B, in the second chamber 93, the selenium layer 91 is desorbed and a thin layer of mercury selenide 18 (FIG. 17) is deposited at about 100° C. in the mercury based MBE chamber.

The zinc telluride selenide layer 19 of the present invention can be grown in the first MBE chamber 92 using the same growth temperature (about 250° C.) as the optical heterostructure 11 of the integrated heterostructure device. Moreover, the graded layer can be doped p-type using nitrogen from the same doping source that is used to prepare the p-type layers of the optical portion 11 of the integrated heterostructure device. Accordingly, the fabrication process for the graded layer of zinc telluride selenide is simpler than the graded zinc mercury selenide layer described in FIGS. 18A and 18B.

Figure 20:
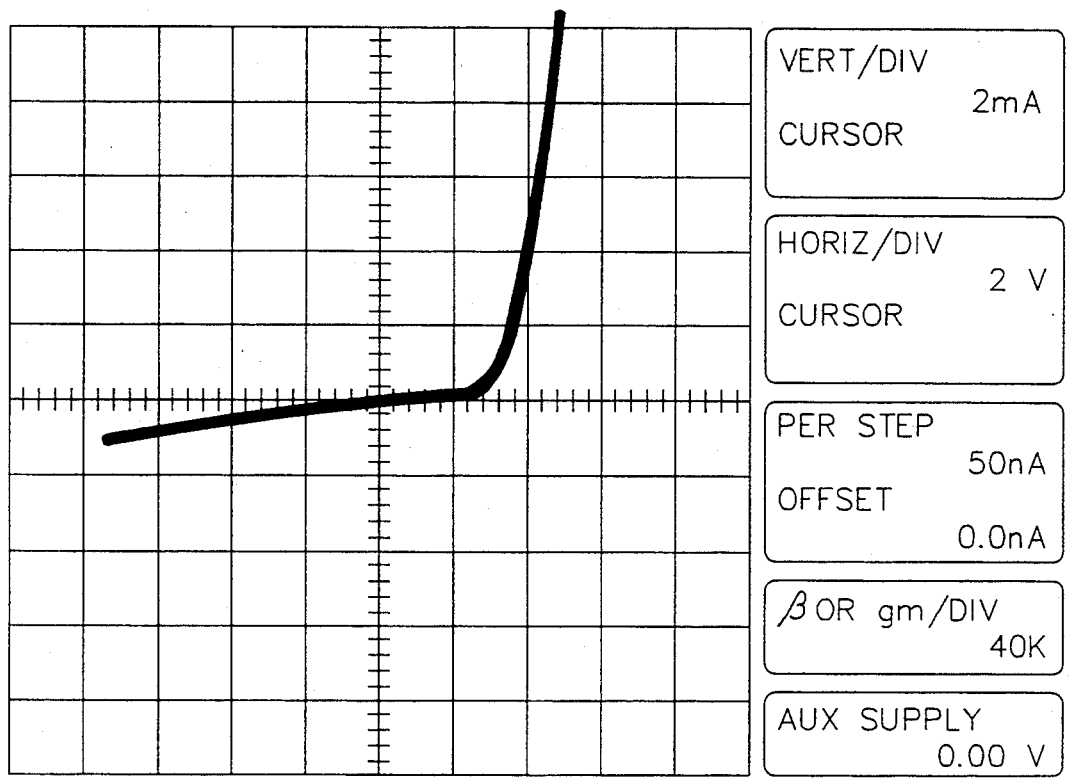
FIG. 20 graphically illustrates the current-voltage relationship for a light emitting diode which does not include an ohmic contact according to the present invention.
Figure 21:
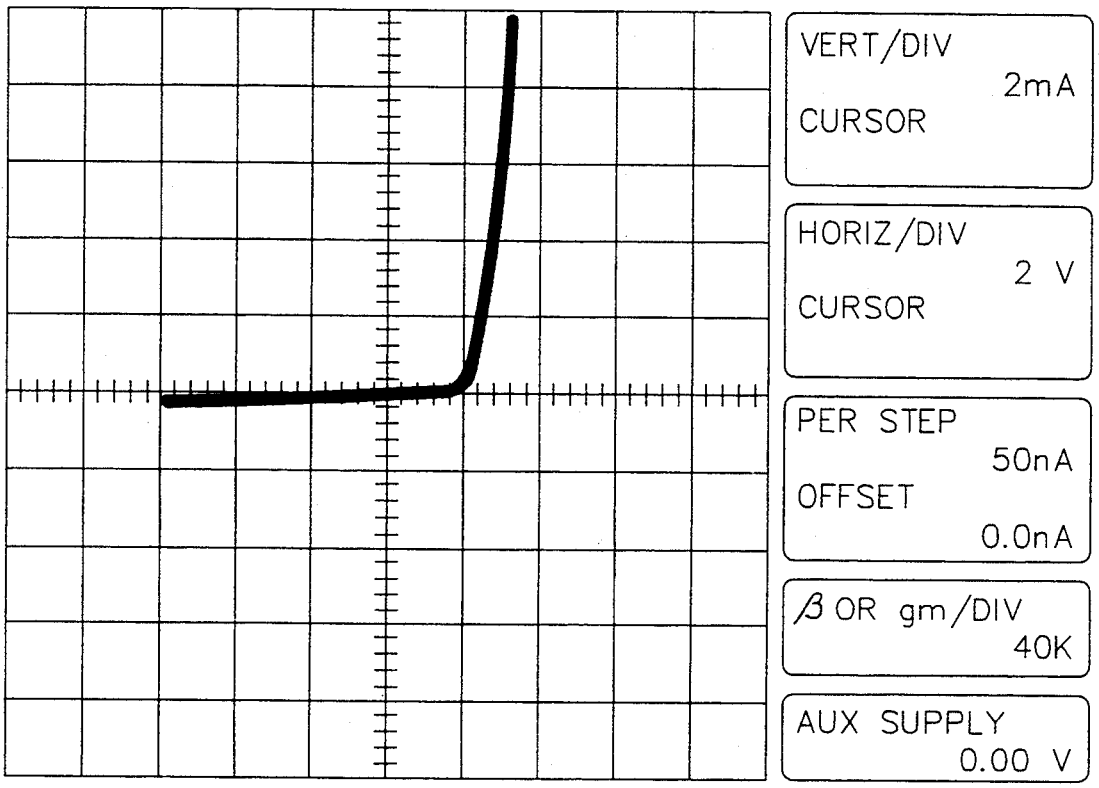
FIG. 21 graphically illustrates the current-voltage relationship for a light emitting diode which includes an ohmic contact according to the present invention.

FIGS. 20 and 21 graphically illustrate the improved performance obtained using the zinc telluride selenide layer 19 according to the present invention. Two identical structures, differing only in the presence of the zinc telluride selenide layer were grown to compare the performance of the integrated heterostructure with and without the zinc telluride selenide layer. In particular, the optical heterostructure 11 of FIG. 16E was grown in the first MBE system 92 (FIG. 18A or 19A) and capped with a thin layer of selenium. The structure was then transferred to the second MBE system 93 (FIG. 18B or 19B) where the selenium was desorbed and the thin mercury selenide layer was grown at about 100° C. Then, half of the sample was processed into light emitting diodes, while the other half was reinserted into first chamber 92 (FIG. 18A or 19A). The mercury selenide layer was desorbed and a linear graded, all p-type layer of zinc telluride selenide was grown. The sample was again capped with selenium and reinserted into the second MBE chamber 93 (FIG. 19B) where the selenium layer was desorbed and the thin mercury selenide layer 18 was grown by MBE. Accordingly, a sample with identical optical heterostructures was prepared, with and without the zinc telluride selenide layer 19.

FIG. 20 illustrates the properties of the LED structure with the zinc tellurium selenide layer 19 absent. As shown, the diode turns on, or begins conducting appreciable current, at about 2.8 volts and generates 10 milliamperes at about 4.4 volts. The forward bias characteristics are "soft", because of the 0.6 electron volt barrier between mercury selenide and zinc selenide.

FIG. 21 graphically illustrates the properties of the identical LED structure including the layer of zinc telluride selenide. As shown, the turn-on voltage is reduced to about 1.9 electron volts and the LED generates 10 milliamperes at about 3.2 electron volts. In addition, the forward bias characteristics of the diode correspond to a series resistance of only about 75Ω. This is reflected in the much sharper forward bias characteristics compared with FIG. 20.

Hall effect measurements using a mercury selenide ohmic contact yield a room temperature mobility $m_p$ of 19 cm$^{-2}$/V-s and a room temperature hole concentration of $5 \times 10^{18}$cm$^{-3}$. Based on a review of the literature, it is estimated that the valance band of zinc telluride is within 0.2 eV ± 0.4 eV of that of mercury selenide. See the publications by R. H. Miles et al. entitled *Superlattices of II-VI Semiconductors*, Journal of Crystal Growth, Vol. 85, pp. 188–193 (1987), Kobayashi et al. entitled *Growth and Characterization of ZnSe-ZnTe Strained-Layer Superlattices*, Journal of Crystal Growth, Vol. 81, pp. 495–500 (1987), and Y. Rajakarunanayake et al. entitled *Band Offset of the ZnSe-ZnTe Superlattices: A Fit to Photoluminescence Data* by k.p Theory, Journal of Vacuum Science Technology, Vol. B6, No. 4, July/August 1988, pp. 1354–1359. By optimizing the p-type doping of the zinc telluride selenide layer and its grading, shape and thickness, it should be possible to further reduce the series resistance to less than 10Ω.

Similar procedures may be used to fabricate a variety of other integrated heterostructures for blue laser, blue LED, green laser and green LED applications, and other applications. The color output of a particular device is determined by the cadmium content of the zinc cadmium selenide layers in the active regions of the structure. The degree of optical confinement is determined by the sulfur content in the zinc sulfur selenide cladding layers. The graded structure of p-type doped zinc mercury selenide or zinc telluride selenide 19 further reduces the valance band offset between mercury selenide and zinc selenide and thus further reduces the series resistance of the ohmic contact. The series resistance and turn-on voltage of the optical device is thereby minimized.

It is also possible to grow p-on-n integrated heterostructure devices on insulating substrates. This might be desirable, for example, because of the limited availability of n-type ZnSe substrates at present. If an insulating substrate is employed, the multilayered growth sequence remains unchanged from that described above. However, the finished wafers are processed differently so that an ohmic contact can be made to the initial n-type epitaxial layer of the structure. This can be done by employing standard photolithography/etching techniques to define mesas and etch down to the n-type layer as shown in FIG. 16. A 1% bromine in methanol solution is a suitable etchant for the Hg-based layers. A solution of 1 gm potassium dichromate ($K_2Cr_2O_7$), 10 ml sulfuric acid ($H_2SO_4$), and 20 ml of deionized water is suitable for etching ZnSe and related alloys. Both solutions are compatible with available photoresists. Following this etching step, ohmic contact to the n-type layer can then be achieved by photolithographically defining and opening via regions to the n-type layer and depositing an appropriate metal such as indium, or indium/gold. Standard liftoff techniques can then be used to remove the deposited metal from unwanted areas of the structure.

Figure 22:
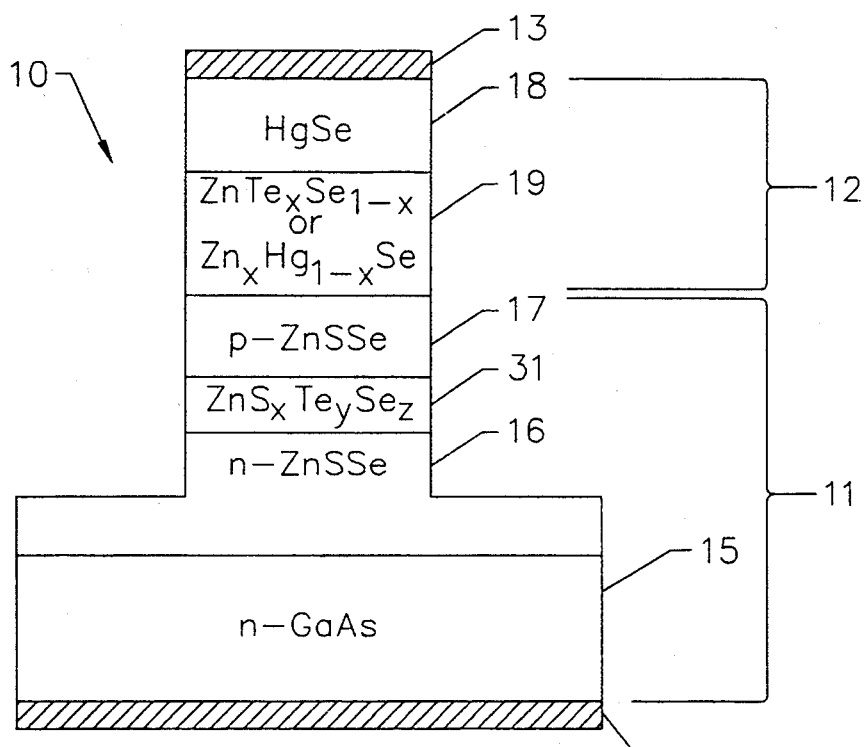
FIGS. 22 and 23 are cross-sectional illustrations of alternative integrated heterostructures according to the present invention.

Referring now to FIG. 22, a high efficiency blue/green light emitting diode according to the present invention is illustrated. Diode 10 includes the quaternary alloy zinc sulfur telluride selenide ($ZnS_xTe_ySe_x$, where $x+y+z=1$) between layers of zinc sulfur selenide (ZnSSe). In particular, as shown in FIG. 22, a substrate 15 of n-type gallium arsenide includes a layer 16 of n-type zinc sulfur selenide thereon. Preferably, layer 16 is $ZnS_{0.07}Se_{0.93}$, which is lattice matched to gallium arsenide. Region 31 of $ZnS_xTe_ySe_x$ is formed on region 16 and p-type zinc sulfur selenide region 17 is formed thereon. An ohmic contact such as a layer of zinc mercury selenide or zinc telluride selenide 19 and a layer of mercury selenide is included. Metal contact layers 13 and 14 are also included as was described above. Cladding layers 16 and 17 are preferably doped at $1 \times 10^{18}$ dopants cm$^{-2}$ and layer 31 is preferably about 1000 Å thick for an LED and about 100–200 Å thick for a laser. It will also be understood by those having skill in the art that a multiple quantum well of zinc sulfur telluride selenide and zinc sulfur selenide may be provided between cladding layers 16 and 17.

Figure 23:
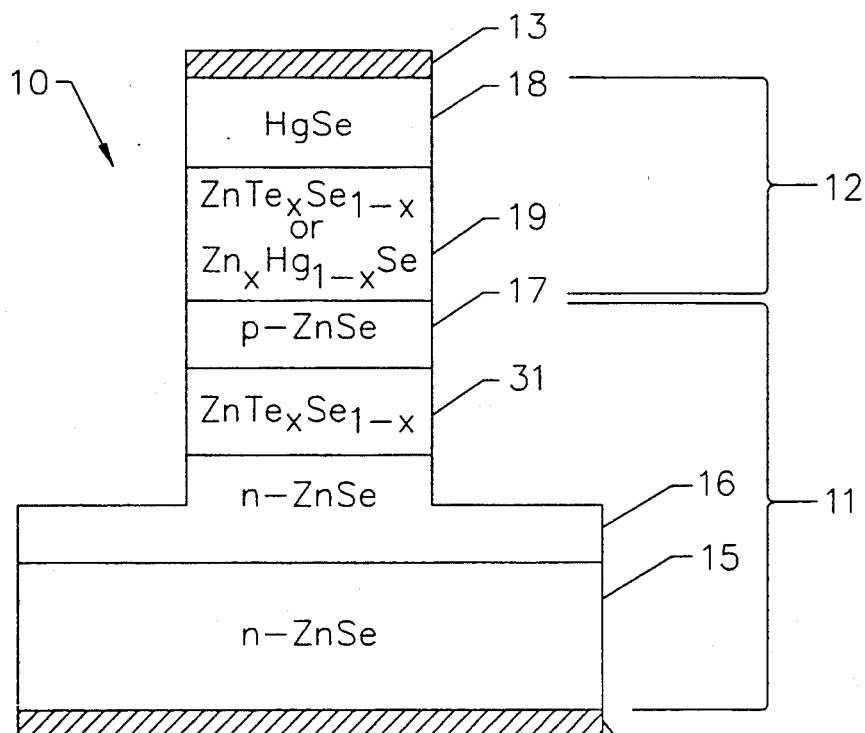

FIG. 23 illustrates a similar structure which is optimized for formation on n-type zinc selenide substrate 15. Since the substrate 15 is zinc selenide, sulfur is not employed in this structure.

Figure 24:
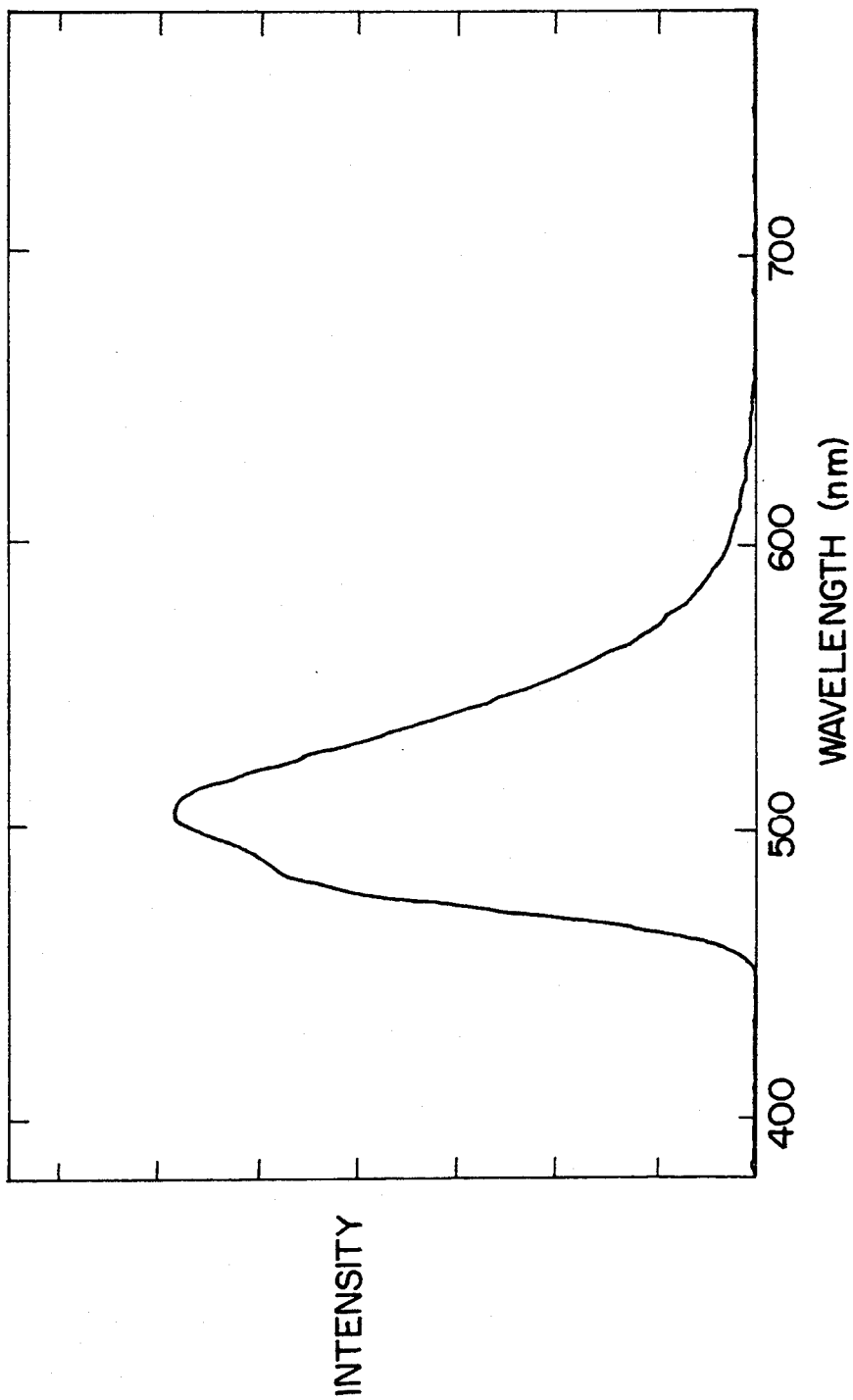
FIG. 24 graphically illustrates wavelength versus intensity for the structure of FIG. 22.

Tellurium is known to form an isoelectronic trap in zinc selenide and zinc sulfur selenide which produces a broad and intense light output in the blue/green spectral region as measured by photoluminescence and electroluminescence experiments. The addition of tellurium to the active region 31 of the optical emitter produces an isoelectronic trap similar to that which occurs when tellurium is added to zinc selenide, which results in intense broadband photoluminescent and electroluminescent output in the green to blue/green spectral region at room temperature, depending on the tellurium content of the alloy 31. FIG. 24 illustrates the spectral output (wavelength versus arbitrary intensity) of an LED fabricated according to FIG. 22. At a temperature of 300° K. and an input current of 50 milliamps, the green LED exhibits an absolute efficiency η of $6 \times 10^{-4}$ and an output power of 85 microwatts. The peak wavelength is 504 nanometers and the dominant wavelength is 503 nanometers. The optical purity is 61%. Optimization of the materials growth parameters, layer thicknesses and device packaging may be expected to give rise to even higher LED efficiencies at room temperature.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming an ohmic contact for a Group II-VI compound semiconductor device including a layer of p-type zinc selenide (ZnSe) or an alloy thereof, said ohmic contact forming method comprising the steps of:

epitaxially forming a zinc telluride selenide (ZnTe$_x$Se$_{1-x}$) layer on said layer of p-type ZnSe or an alloy thereof, where $0<x<1$;

epitaxially forming a mercury selenide (HgSe) layer on said ZnTe$_x$Se$_{1-x}$ layer; and forming a conductor layer on said HgSe layer.

2. The method of claim 1 wherein said zinc telluride selenide layer is epitaxially formed with x being constant to provide a step graded ZnTe$_x$Se$_{1-x}$ layer.

3. The method of claim 1 wherein said zinc telluride selenide layer is epitaxially formed with x decreasing from said ZnSe layer to said HgSe layer, to provide a graded ZnTe$_x$Se$_{1-x}$ layer.

4. The method of claim 3 wherein said zinc telluride selenide layer is epitaxially formed with x decreasing linearly from said ZnSe layer to said HgSe layer, to provide a linear graded ZnTe$_x$Se$_{1-x}$ layer.

5. The method of claim 3 wherein said zinc telluride selenide layer is epitaxially formed with x decreasing nonlinearly from said ZnSe layer to said HgSe layer, to provide a nonlinear graded ZnTe$_x$Se$_{1-x}$ layer.

6. The method of claim 5 wherein said zinc telluride selenide layer is epitaxially formed with x decreasing parabolically from said ZnSe layer to said HgSe layer, to provide a parabolic graded ZnTe$_x$Se$_{1-x}$ layer.

7. The method of claim 1 wherein at least a portion of said ZnTe$_x$Se$_{1-x}$ layer is epitaxially formed p-type.

8. The method of claim 7 wherein said ZnTe$_x$Se$_{1-x}$ layer is epitaxially formed p-type adjacent said ZnSe layer, and is epitaxially formed of neutral conductivity adjacent said HgSe layer.

9. The method of claim 6 wherein a first half of said ZnTe$_x$Se$_{1-x}$ layer adjacent said ZnSe layer is epitaxially formed p-type, and a second half of said ZnTe$_x$Se$_{1-x}$ layer adjacent said HgSe layer is of epitaxially formed neutral conductivity.

10. The method of claim 1 wherein said zinc telluride selenide layer forming step further comprises the step of p-type modulation doping said zinc telluride selenide layer.

11. The method of claim 1 wherein the following step is performed between said epitaxially forming steps: epitaxially forming a layer of zinc telluride (ZnTe) between said layers of ZnTe$_x$Se$_{1-x}$ and HgSe.

12. A method of forming a Group II-VI compound semiconductor device comprising the steps of:

forming in a first chamber, a first heterostructure of zinc-based Group II-VI compound semiconductor materials including a top layer of zinc telluride;

forming in said first chamber, an overcoat layer on said top layer of zinc telluride;

transferring said first heterostructure including said overcoat layer to a second chamber;

removing said overcoat layer in said second chamber; and forming in said second chamber, a second heterostructure of at least one mercury based Group II-VI compound semiconductor material on said top layer of zinc telluride.

13. The method of claim 12 wherein said first heterostructure forming step comprises the step of epitaxially depositing said first heterostructure in a first molecular beam epitaxy chamber.

14. The method of claim 12 wherein said second heterostructure forming step comprises the step of epitaxially depositing said second heterostructure in a second molecular beam epitaxy chamber.

15. The method of claim 12 wherein said overcoat layer forming step comprises the step of forming a selenium overcoat layer on said first heterostructure.

16. The method of claim 12 wherein said transforming step occurs at room temperature and atmospheric pressure.

17. A method of forming an ohmic contact for a Group II-VI compound semiconductor device including a layer of p-type zinc selenide (ZnSe) or an alloy thereof, said ohmic contact forming method comprising of steps of:

epitaxially forming a zinc mercury selenide (Zn$_x$Hg$_{1-x}$Se) layer on said layer of p-type ZnSe or an alloy thereof, where $0<x<1$;

epitaxially forming a mercury selenide (HgSe) layer on said Zn$_x$Hg$_{1-x}$Se layer; and forming a conductor layer on said HgSe layer.

18. The method of claim 17 wherein said zinc mercury selenide layer is epitaxially formed with x being constant to provide a step graded Zn$_x$Hg$_{1-x}$Se layer.

19. The method of claim 17 wherein said zinc mercury selenide layer is epitaxially formed with x decreasing from said ZnSe layer to said HgSe layer, to provide a graded Zn$_x$Hg$_{1-x}$Se layer.

20. 57. The method of claim 19 wherein said zinc mercury selenide layer is epitaxially formed with x decreasing linearly from said ZnSe layer to said HgSe layer, to provide a linear graded Zn$_x$Hg$_{1-x}$Se layer.

21. The method of claim 19 wherein said zinc mercury selenide layer is epitaxially formed with x decreasing nonlinearly from said ZnSe layer to said HgSe layer, to provide a nonlinear graded Zn$_x$Hg$_{1-x}$Se layer.

22. The method of claim 21 wherein said zinc mercury selenide layer is epitaxially formed with x decreasing parabolically from said ZnSe layer to said HgSe layer, to provide a parabolic graded Zn$_x$Hg$_{1-x}$Se layer.

23. The method of claim 17 wherein at least a portion of said Zn$_x$Hg$_{1-x}$Se layer is epitaxially formed p-type.

24. The method of claim 23 wherein said Zn$_x$Hg$_{1-x}$Se layer is epitaxially formed p-type adjacent said ZnSe layer, and is epitaxially formed of neutral conductivity adjacent said HgSe layer.

25. The method of claim 22 wherein a first half of said Zn$_x$Hg$_{1-x}$Se layer adjacent said ZnSe layer is epitaxially formed p-type, and a second half of said Zn$_x$Hg$_{1-x}$Se layer adjacent said HgSe layer is of epitaxially formed neutral conductivity.

26. The method of claim 17 wherein said zinc mercury selenide layer forming step further comprises the step of p-type modulation doping said zinc mercury selenide layer.

27. A method of forming an ohmic contact for a Group II-VI compound semiconductor device, said ohmic contact forming method comprising the steps of:

epitaxially forming a ternary compound Group II-VI semiconductor material on said Group II-VI semiconductor device;

epitaxially forming a Group II-VI semimetal on said ternary compound Group II-VI semiconductor material; and forming a conductor on said Group II-VI semimetal.

28. The method of claim 27 wherein said ternary compound Group II-VI semiconductor material is zinc mercury selenide.

29. The method of claim 27 wherein said Group II-VI semimetal is mercury selenide.

30. The method of claim 27 wherein said conductor is a metal.

31. A method of forming an ohmic contact for a Group II-VI compound semiconductor device including a layer of p-type zinc selenide (ZnSe) or an alloy thereof, said ohmic contact forming method comprising the steps of:

epitaxially forming a mercury selenide (HgSe) heterostructure on said p-type ZnSe layer; and forming a conductor layer on said HgSe heterostructure.

32. The method of claim 31 wherein said conductor layer is a metal layer.

33. A method of forming a Group II-VI compound semiconductor device comprising the steps of:

forming in a first chamber, a first heterostructure of zinc-based Group II-VI compound semiconductor materials;

forming in said first chamber, an overcoat layer on said first heterostructure;

transferring said first heterostructure including said overcoat layer to a second chamber;

removing said overcoat layer in said second chamber; and forming in said second chamber, a second heterostructure of mercury based Group II-VI compound semiconductor materials on said first heterostructure.

34. The method of claim 33 wherein said first heterostructure forming step comprises the step of epitaxially depositing said first heterostructure in a first molecular epitaxy chamber.

35. The method of claim 33 wherein said second heterostructure forming step comprises the step of epitaxially depositing said second heterostructure in a second molecular beam epitaxy chamber.

36. The method of claim 33 wherein said overcoat layer forming step comprises the step of forming a selenium overcoat layer on said first heterostructure.

37. The method of claim 33 wherein said transforming step occurs at room temperature and atmospheric pressure.

* * * * *

UNITED STATES PATENT AND TRADEMARK OFFICE
CERTIFICATE OF CORRECTION

PATENT NO. : 5,366,927

DATED : November 22, 1994

INVENTOR(S) : Jan F. Schetzina

It is certified that error appears in the above-identified patent and that said Letters Patent is hereby corrected as shown below:

On the title page: Item

[60] Related U.S. Application Data

In the last two lines, Serial No. 881,599 should list a filing date of --May 12, 1992--, not "August 21, 1992".

Column 11, line 62, please delete "$16i$" and substitute --$16m$-- therefor.
Column 13, line 2, please delete "87" and substitute --11-- therefor.
Column 16, line 10, please delete "$ZnS_xTe_ySe_x$" and substitute --$ZnS_xTe_ySe_z$-- therefor.
Column 16, line 16, please delete "$ZnS_xTe_ySe_x$" and substitute --$ZnS_xTe_ySe_z$-- therefor.
Column 16, line 24, please delete "|" and substitute --Å-- therefor.

UNITED STATES PATENT AND TRADEMARK OFFICE
CERTIFICATE OF CORRECTION

PATENT NO.   : 5,366,927
DATED        : November 22, 1994
INVENTOR(S)  : Jan F. Schetzina It is certified that error appears in the above-indentified patent and that said Letters Patent is hereby corrected as shown below:

Column 18, line 25, please delete "57".

Signed and Sealed this

Twenty-sixth Day of September, 1995

Attest:

BRUCE LEHMAN

Attesting Officer         Commissioner of Patents and Trademarks